US009627471B2

United States Patent
Hirler et al.

(10) Patent No.: US 9,627,471 B2
(45) Date of Patent: *Apr. 18, 2017

(54) SUPER JUNCTION SEMICONDUCTOR DEVICE HAVING STRIP STRUCTURES IN A CELL AREA

(71) Applicant: Infineon Technologies Austria AG, Villach (AT)

(72) Inventors: Franz Hirler, Isen (DE); Hans Weber, Bayerisch Gmain (DE); Stefan Gamerith, Villach (AT); Armin Willmeroth, Augsburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 14/801,040

(22) Filed: Jul. 16, 2015

(65) Prior Publication Data
US 2015/0325641 A1  Nov. 12, 2015

Related U.S. Application Data

(63) Continuation of application No. 13/874,965, filed on May 1, 2013, now Pat. No. 9,117,694.

(51) Int. Cl.
*H01L 29/78* (2006.01)
*H01L 29/06* (2006.01)
(Continued)

(52) U.S. Cl.
CPC ........ *H01L 29/0634* (2013.01); *H01L 29/063* (2013.01); *H01L 29/0649* (2013.01);
(Continued)

(58) Field of Classification Search
CPC ............... H01L 29/634; H01L 29/7811; H01L 29/7397; H01L 29/0696; H01L 29/7813;
(Continued)

(56) References Cited

U.S. PATENT DOCUMENTS 6,546,516 B1  4/2003  Wright et al.
6,576,516 B1  6/2003  Blanchard
(Continued)

FOREIGN PATENT DOCUMENTS

CN         1767211 A     5/2006
CN       101083284 A    12/2007
(Continued)

OTHER PUBLICATIONS

Kambiba, R. et al., "Design of Trench Termination for High Voltage Devices", IEEE Proceedings of the 22nd International Symposium on Power Semicondutor Devices and ICs, Hiroshima, Japan, Jun. 6-10, 2010, pp. 107-110.
(Continued)

*Primary Examiner* — Galina Yushina
(74) *Attorney, Agent, or Firm* — Murphy, Bilak & Homiller, PLLC

(57) ABSTRACT

A super junction semiconductor device includes a semiconductor portion having strip structures in a cell area. Each strip structure has a compensation structure with first and second sections inversely provided on opposite sides of a fill structure. Each section has first and second compensation layers of complementary conductivity types. The strip structures are linear stripes extending through the cell area in a first lateral direction and into an edge area surrounding the cell area in lateral directions. Each strip structure has an end section with a termination portion in the edge area in which the first compensation layer of the first section is connected with the first compensation layer of the second section via a first conductivity layer, and the second compensation layer of the first section is connected with the second compensation layer of the second section via a second conductivity layer.

8 Claims, 16 Drawing Sheets

(51) Int. Cl.
*H01L 29/739* (2006.01)
*H01L 29/10* (2006.01)
*H01L 29/08* (2006.01)
H01L 29/417 (2006.01)
H01L 29/861 (2006.01)

(52) U.S. Cl.
CPC ...... *H01L 29/0653* (2013.01); *H01L 29/0696* (2013.01); *H01L 29/0878* (2013.01); *H01L 29/105* (2013.01); *H01L 29/7397* (2013.01); *H01L 29/7802* (2013.01); *H01L 29/7811* (2013.01); *H01L 29/7813* (2013.01); *H01L 29/41766* (2013.01); *H01L 29/7396* (2013.01); *H01L 29/861* (2013.01)

(58) Field of Classification Search
CPC . H01L 29/063; H01L 29/105; H01L 29/7827; H01L 29/7802; H01L 29/0653; H01L 29/41766; H01L 29/0649; H01L 29/0878; H01L 29/7396
See application file for complete search history.

(56) References Cited

U.S. PATENT DOCUMENTS

| | | | |
|---|---|---|---|
| 6,630,698 B1 | 10/2003 | Deboy et al. | |
| 7,892,924 B1 | 2/2011 | Lee et al. | |
| 8,421,152 B2* | 4/2013 | Sasaki | H01L 29/0634 257/339 |
| 8,455,956 B2* | 6/2013 | Saggio | H01L 29/0634 257/341 |
| 2003/0232477 A1 | 12/2003 | Deboy et al. | |
| 2004/0007736 A1 | 1/2004 | Deboy et al. | |
| 2006/0256487 A1 | 11/2006 | Kishimoto et al. | |
| 2007/0148931 A1 | 6/2007 | Tokano et al. | |
| 2008/0111207 A1 | 5/2008 | Lee et al. | |
| 2008/0203470 A1 | 8/2008 | Willmeroth et al. | |
| 2008/0246079 A1 | 10/2008 | Saito et al. | |
| 2010/0059814 A1* | 3/2010 | Loechelt | H01L 29/0634 257/330 |
| 2010/0163846 A1 | 7/2010 | Yilmaz et al. | |
| 2010/0314682 A1 | 12/2010 | Yilmaz et al. | |
| 2011/0101446 A1 | 5/2011 | Guan et al. | |
| 2011/0127586 A1 | 6/2011 | Bobde et al. | |
| 2011/0140167 A1 | 6/2011 | Yilmaz et al. | |
| 2011/0220992 A1* | 9/2011 | Inomata | H01L 29/0634 257/330 |
| 2014/0231903 A1 | 8/2014 | Willmeroth et al. | |

FOREIGN PATENT DOCUMENTS

| | | |
|---|---|---|
| DE | 10057612 A1 | 5/2002 |
| DE | 10196990 T1 | 10/2003 |
| DE | 102004037153 A1 | 3/2006 |
| DE | 102006025218 A1 | 12/2007 |
| DE | 102007030755 B3 | 2/2009 |
| JP | 2001284585 A | 10/2001 |
| JP | 2007251023 A | 9/2007 |
| WO | 0038242 A1 | 6/2000 |
| WO | 2008039548 A2 | 4/2008 |

OTHER PUBLICATIONS

Moens, et al., "UltiMOS : A Local Charge-Balanced Trench-Based 600V Super-Junction Device", IEEE Proceedings of the 23rd International Symposium on Power Semiconductor Devices and ICs, San Diego, CA, USA, May 23-26, 2011, pp. 304-307.

Schmidt, G. et al., "Vertical Edge Termination with Drain-Sided Field Plate", Siemens AG, 2005, pp. 1-7.

Seto, K. et al., "Universal Trench Edge Termination Design", IEEE Proceedings of the 2012 24th International Symposium on Power Semiconductor Devices and ICs, Bruges, Belgium, Jun. 3-7, 2012, pp. 161-164.

Vanmeerbeek, P. et al., "Enhancing the Robustness of a Multiple Floating Field-Limiting Ring Termination by Introducing a Buffer Layer", IEEE Proceedings of the 2012 24th International Symposium on Power Semiconductor Devices and ICs, Burges, Belgium, Jun. 3-7, 2012, pp. 357-360.

Jones, Scotten, "Diffusion in Silicon", ICKnowledge LLC, 2008, pp. 1-10.

* cited by examiner

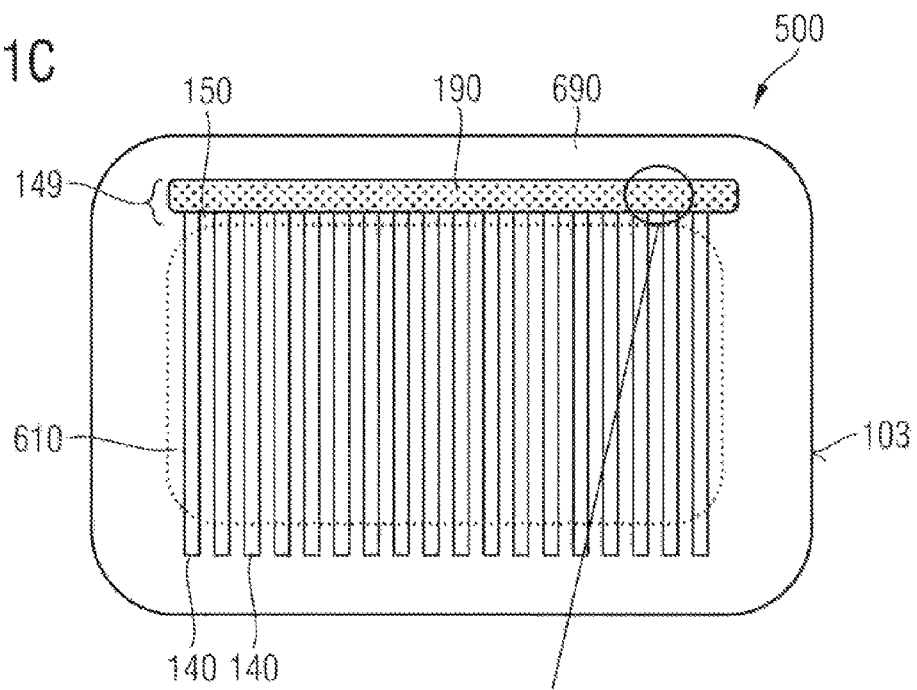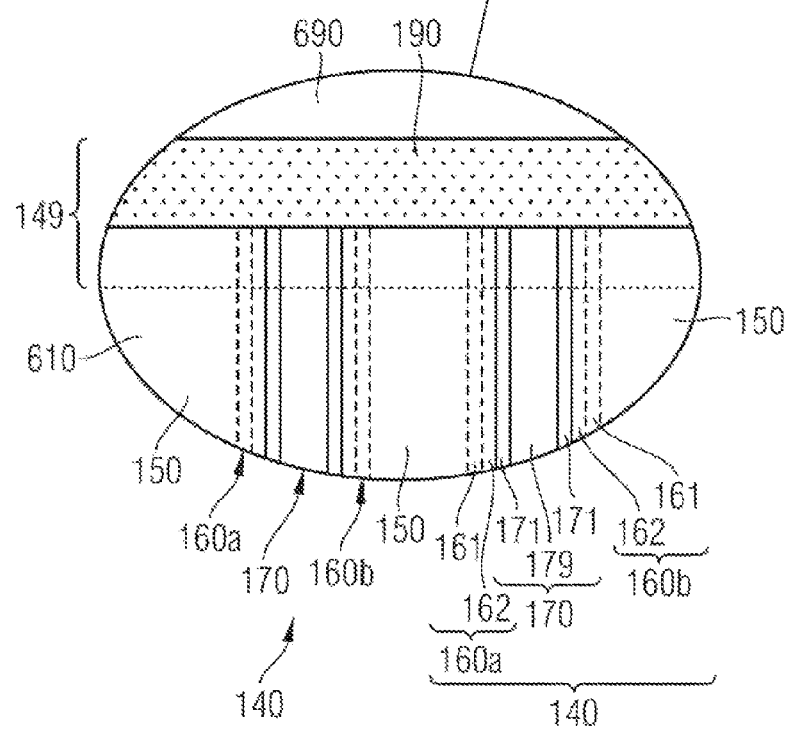

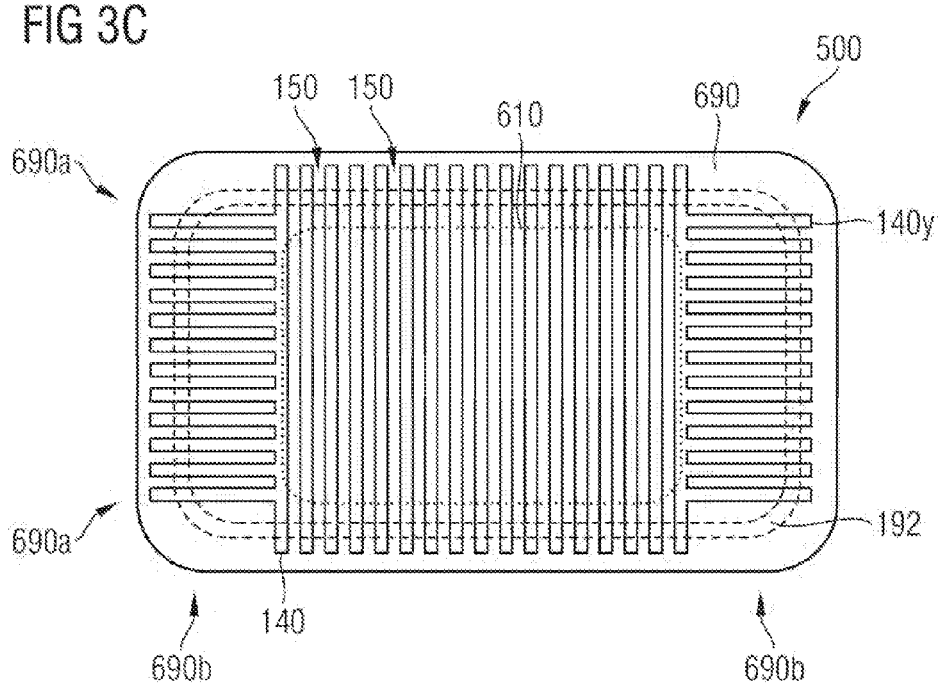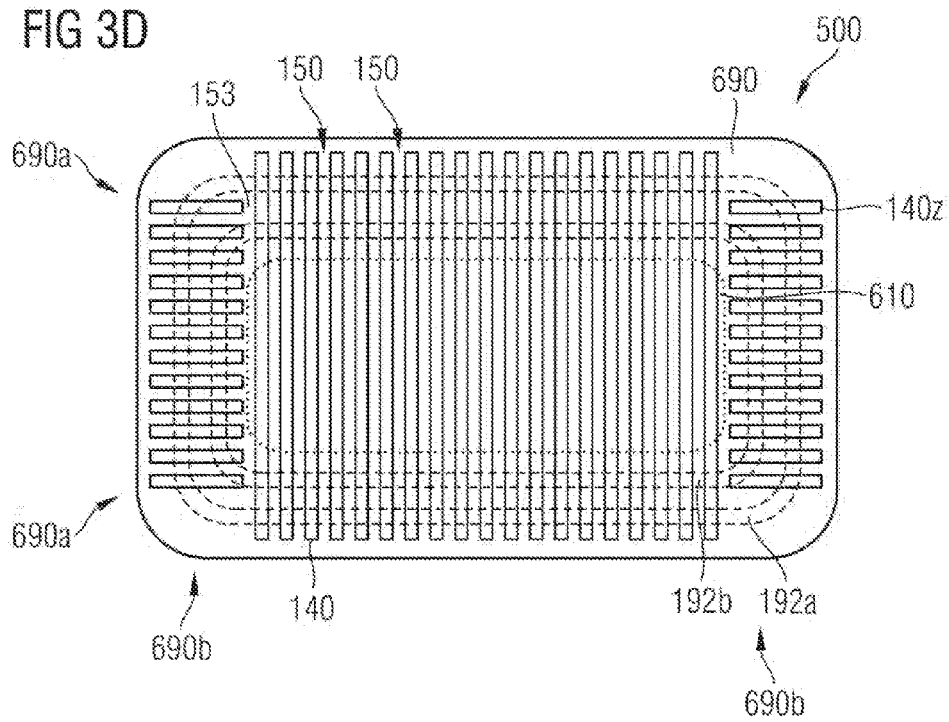

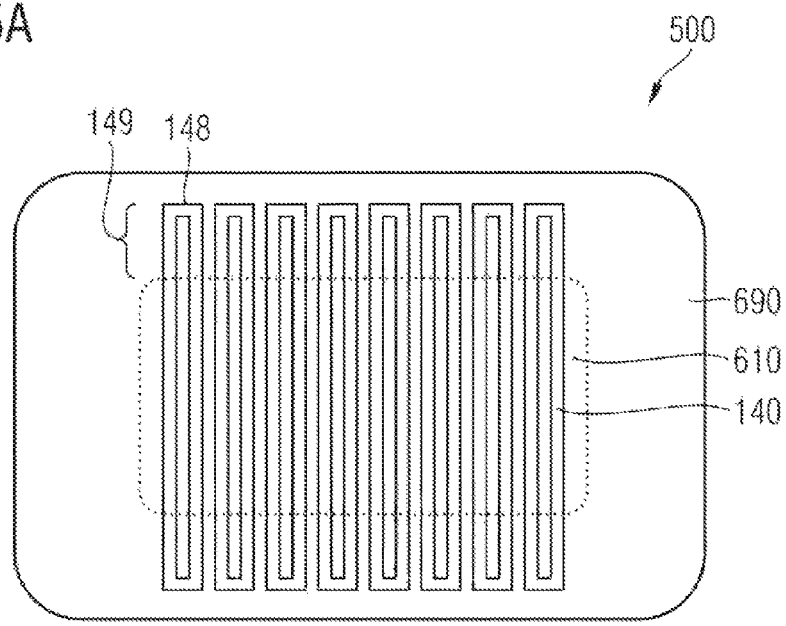
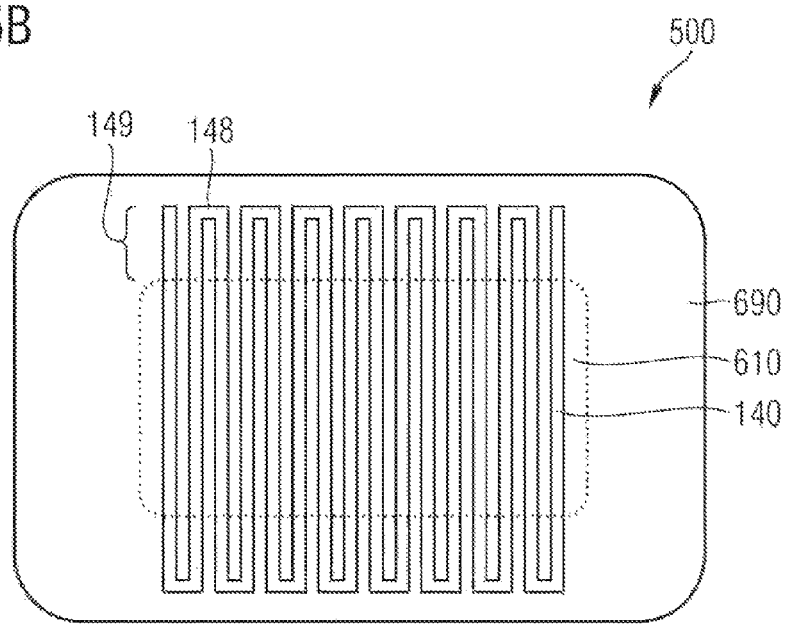

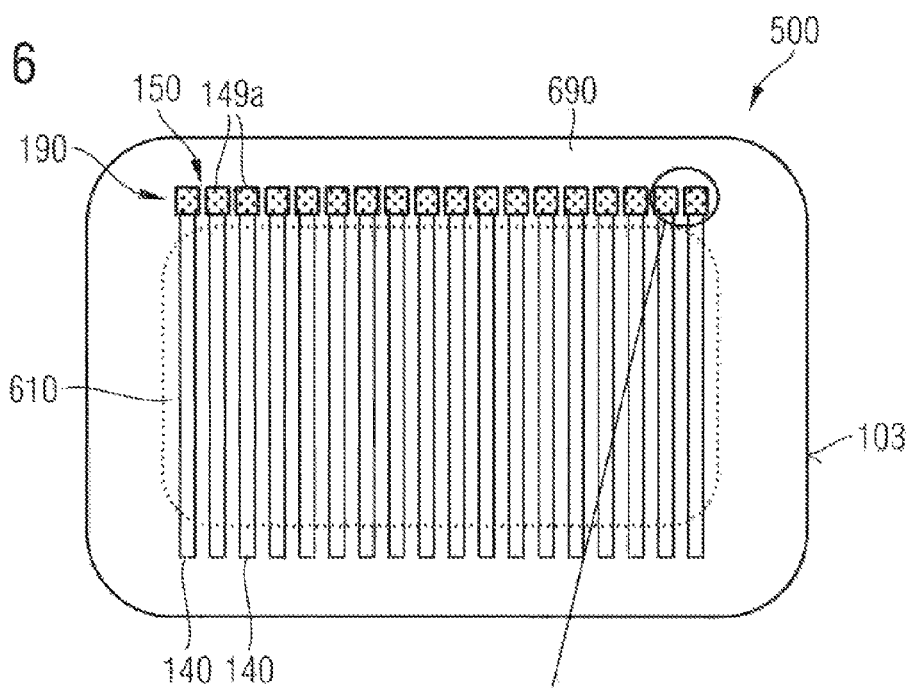
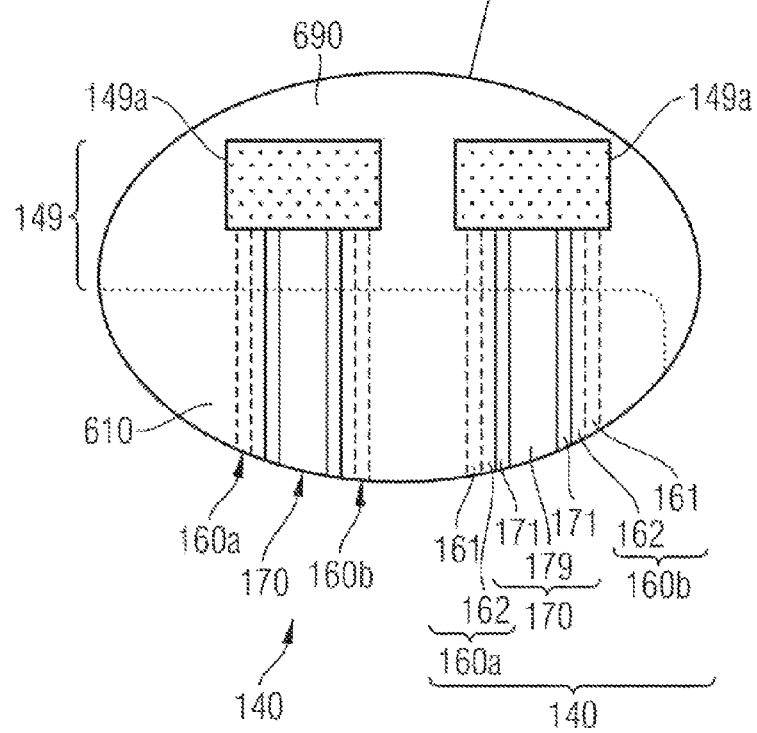

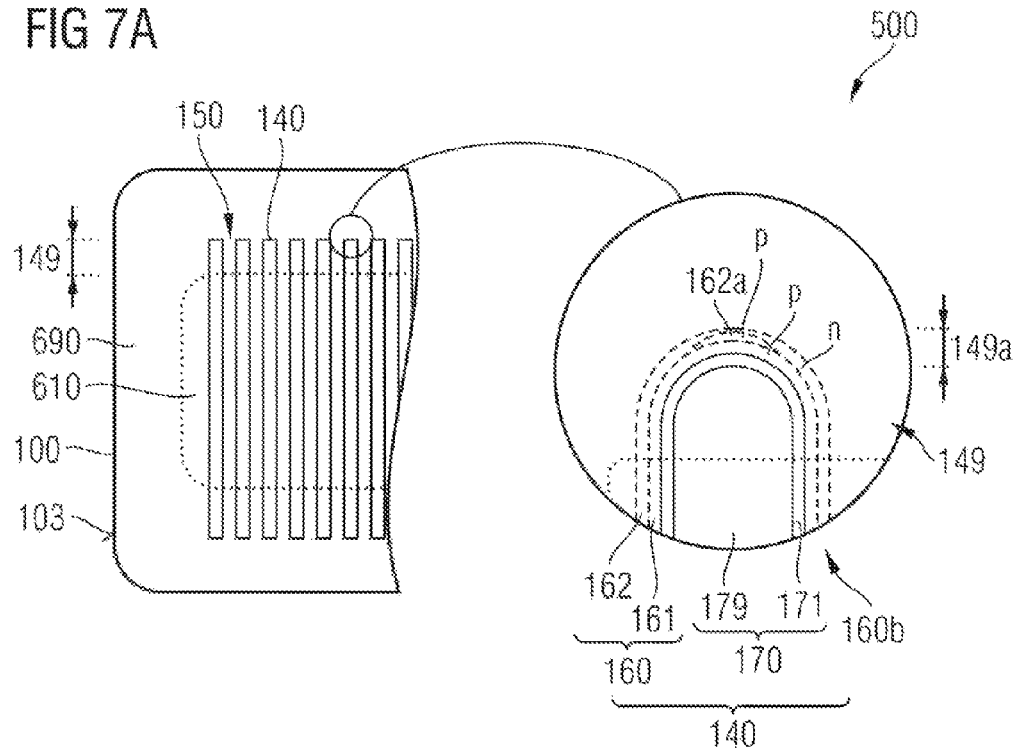
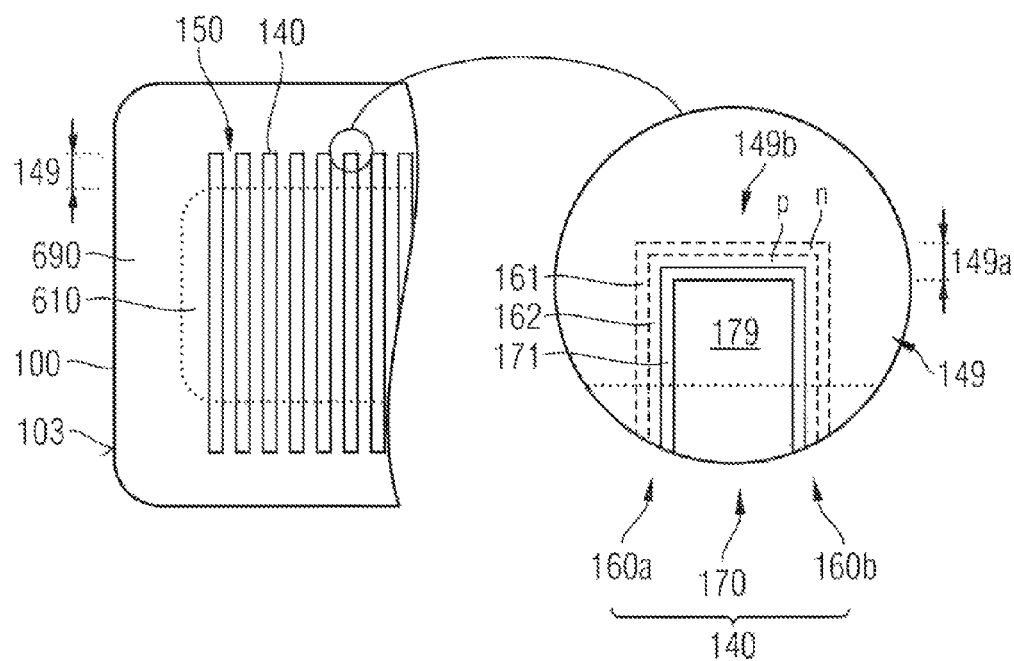

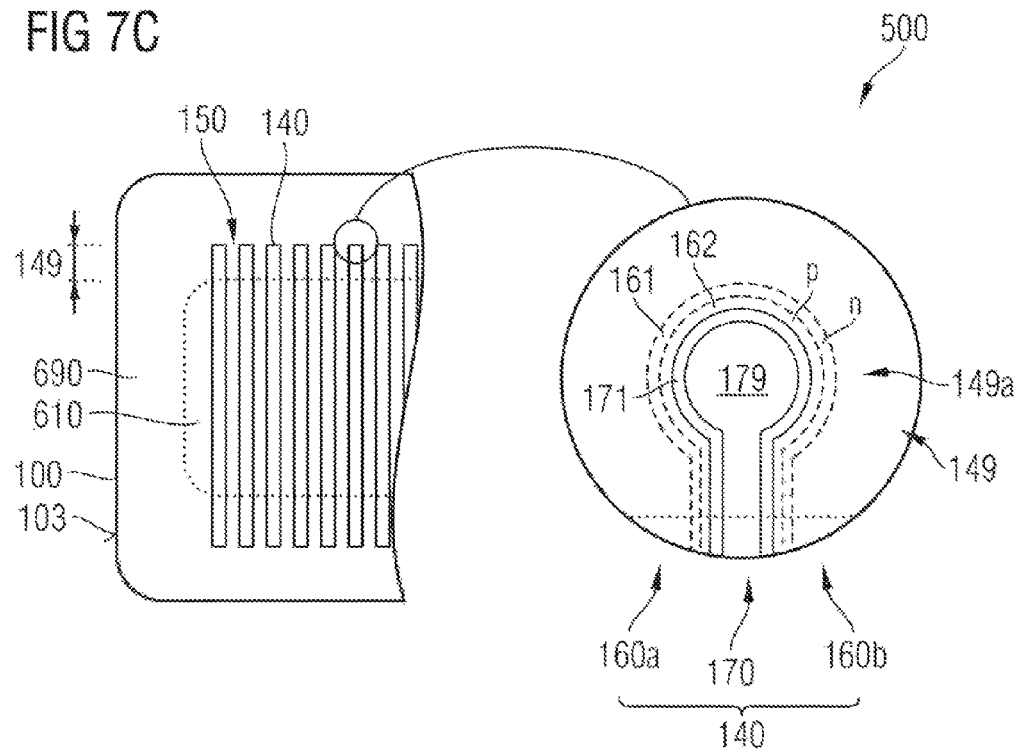
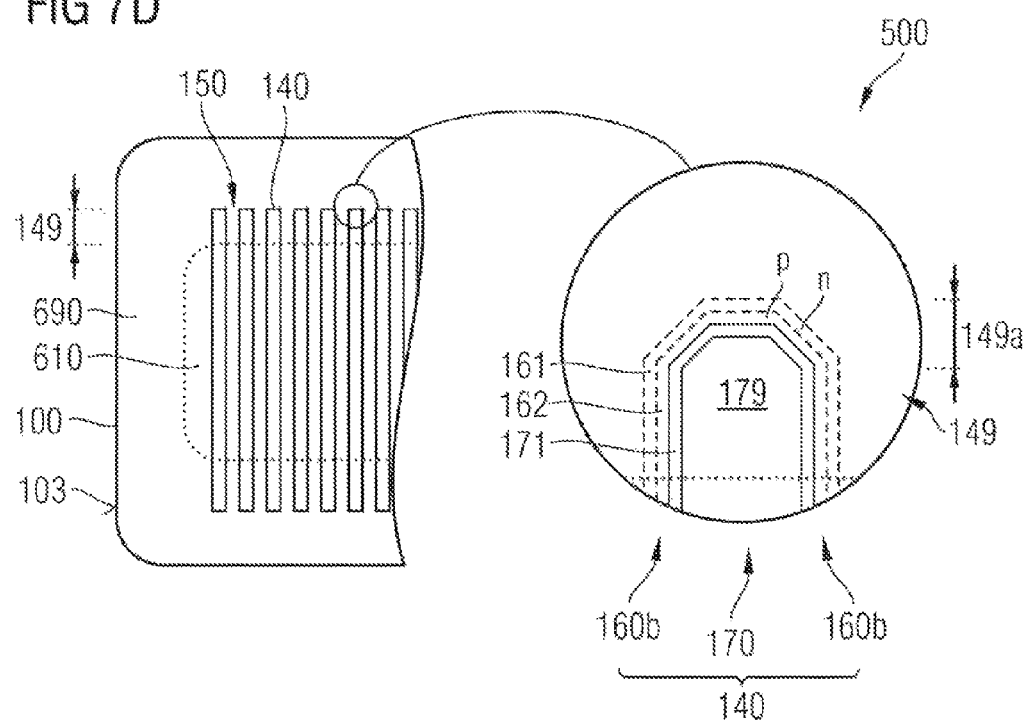

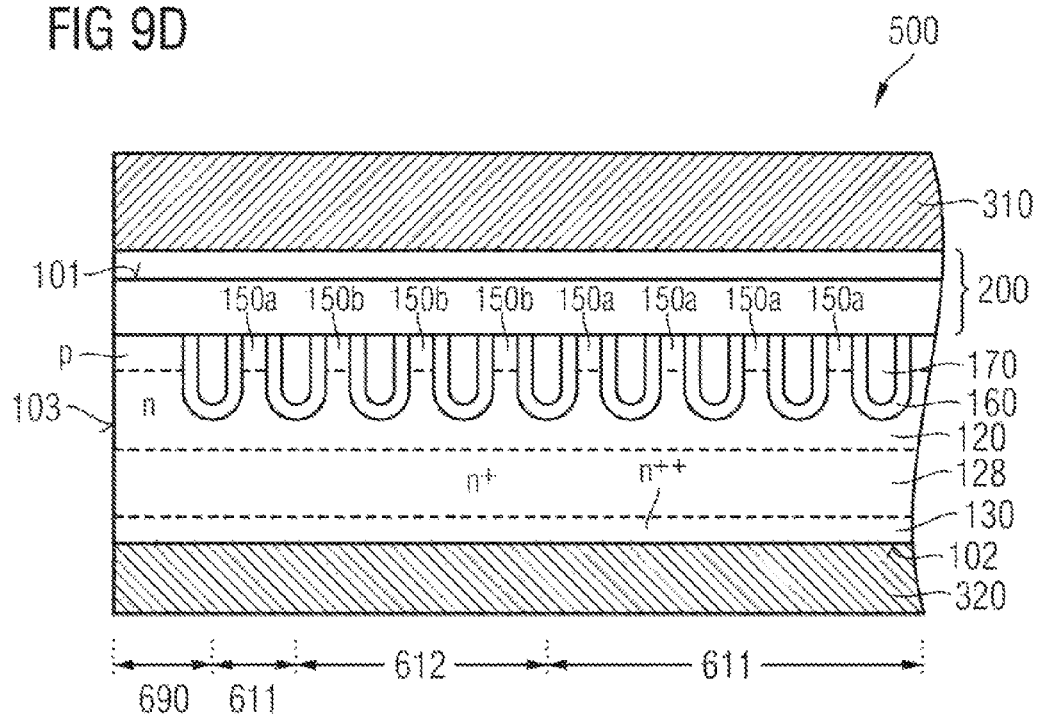
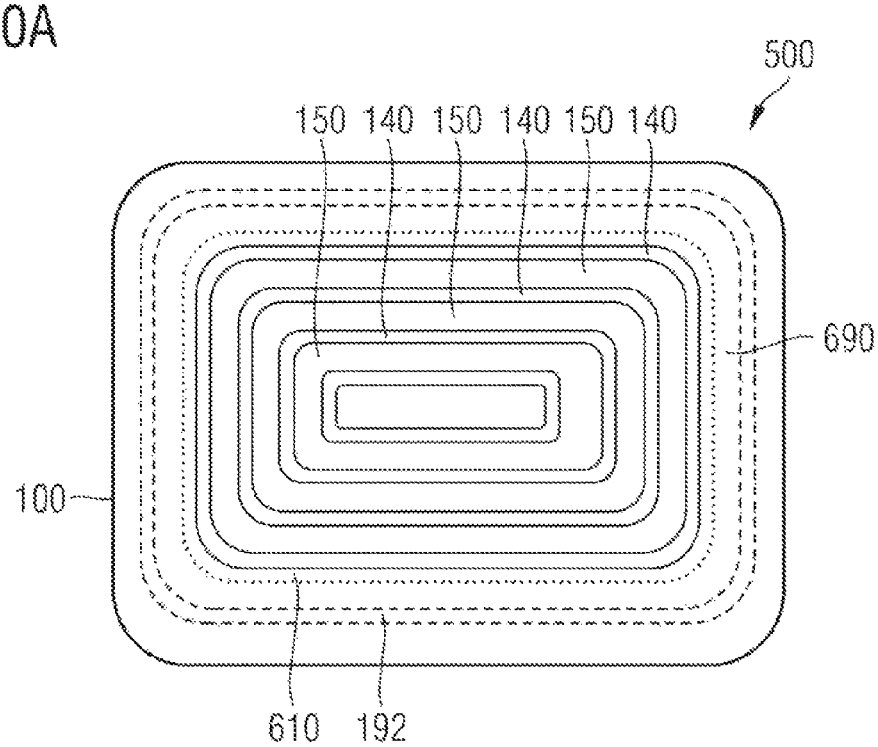

SUPER JUNCTION SEMICONDUCTOR DEVICE HAVING STRIP STRUCTURES IN A CELL AREA

BACKGROUND

A super junction structure of a super junction device based on a trench concept may include two or more pairs of complementary doped compensation layers extending in substance parallel to a flow direction of an on state or forward current flowing in one type of the complementary doped layers in a conductive state of the super junction device. In a reverse blocking mode the complementary doped layer pair is depleted such that the device can accommodate a high reverse breakdown voltage even at a comparatively high impurity concentration in the doped layer carrying the on state or forward current. It is desirable to improve the reliability of super junction semiconductor devices.

SUMMARY

According to an embodiment a semiconductor portion of a super junction semiconductor device includes strip structures between mesa regions that protrude from a base section in a cell area. Each strip structure includes a compensation structure with a first and a second section inversely provided on opposing sides of a fill structure. Each section includes a first compensation layer of a first conductivity type and a second compensation layer of a complementary second conductivity type. The strip structures extend into an edge area surrounding the cell area. In the edge area the strip structures include end sections.

According to another embodiment a semiconductor portion of a super junction semiconductor device includes strip structures between mesa regions that protrude from a base section. Each strip structure includes a compensation structure with a first and a second section inversely provided on opposing sides of a fill structure. Each section includes a first compensation layer of a first conductivity type and a second compensation layer of a complementary second conductivity type. The strip structures are closed loops.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1C shows a schematic planar cross-sectional view of the semiconductor device of FIG. 1A in a plane parallel to a first surface of a semiconductor portion.

FIG. 3C is a schematic planar cross-sectional view of a super junction semiconductor device according to an embodiment providing orthogonal auxiliary strip structures connected to outermost strip structures.

FIG. 3D is a schematic planar cross-sectional view of a super junction semiconductor device according to an embodiment providing orthogonal auxiliary strip structures separated from outermost strip structures.

FIG. 5A is a schematic planar cross-sectional view of a super junction semiconductor device according to an embodiment providing strip structures forming loops.

FIG. 5B is a schematic planar cross-sectional view of a super junction semiconductor device according to an embodiment providing strip structures forming a continuous structure.

FIG. 6 is a schematic planar cross-sectional view of a super junction semiconductor device based on strip structures in accordance with an embodiment providing a correction of the degree of compensation in a termination portion of the strip structures.

FIG. 7A is a schematic planar cross-sectional view of a super junction semiconductor device according to an embodiment providing a correction by an implant zone.

FIG. 7B is a schematic planar cross-sectional view of a super junction semiconductor device according to an embodiment providing a correction by a rectangular termination portion.

FIG. 7C is a schematic planar cross-sectional view according to an embodiment providing a correction by a circumferential termination portion.

FIG. 7D is a schematic planar cross-sectional view of a super junction semiconductor device according to an embodiment providing a correction by a spiky termination portion.

FIG. 9D is a schematic cross-sectional view of a portion of a super junction semiconductor device in accordance with an embodiment providing different impurity quantities in different portions of the cell area.

FIG. 10A is a schematic planar cross-sectional view of a super junction semiconductor device in accordance with an embodiment providing strip structures forming concentric loops in the cell area.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1B:
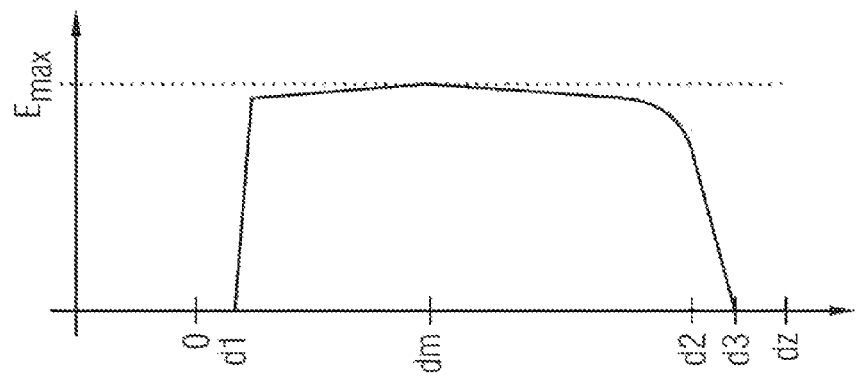
FIG. 1B is a schematic diagram showing the vertical electric field profile of the super junction semiconductor device of FIG. 1A.
Figure 1A:
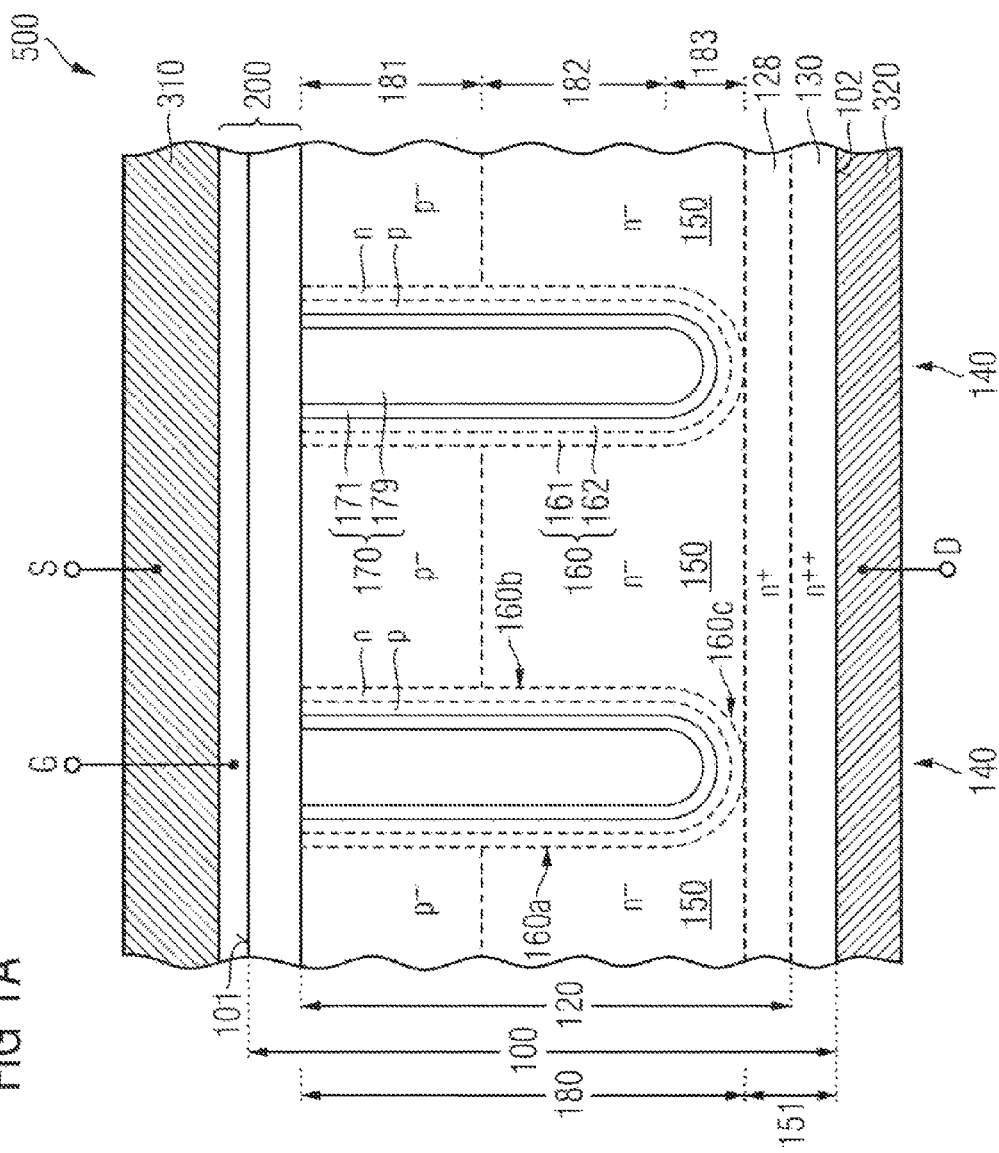
FIG. 1A is a schematic cross-sectional view of a portion of a super junction semiconductor device in accordance with an embodiment providing strip structures extending into an edge area.

FIG. 1A shows a super junction semiconductor device 500 with a semiconductor portion 100 having a first surface 101 and a second surface 102 parallel to the first surface 101. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is at least 40 µm, for example at least 175 µm. The semiconductor portion 100 may have a rectangular shape with an edge length in the range of several millimeters. The normal to the first and second surfaces 101, 102 defines a vertical direction and directions orthogonal to the normal direction are lateral directions.

The semiconductor portion 100 may include an impurity layer 130 of a first conductivity type. The impurity layer 130 may extend along a complete cross-sectional plane of the semiconductor portion 100 parallel to the second surface 102. In case the semiconductor device 500 is an IGFET (insulated gate field effect transistor), the impurity layer 130 directly adjoins the second surface 102 and a mean net impurity concentration in the impurity layer 130 is comparatively high, e.g. at least $5 \times 10^{18}$ cm$^{-3}$. In case the semiconductor device 500 is an IGBT (insulated gate bipolar transistor), a collector layer of a second conductivity type, which is the opposite of the first conductivity type, is arranged between the impurity layer 130 and the second surface 102 and the mean net impurity concentration in the impurity layer 130 may be between $5 \times 10^{12}$ and $5 \times 10^{16}$ cm$^{-3}$, by way of example. For example, a p-type collector layer may replace the n-type impurity layer 130 in FIG. 1A.

The semiconductor portion 100 further includes a drift layer 120 between the first surface 101 and the impurity layer 130. The drift layer 120 includes a super junction structure 180 and may include a pedestal layer 128 of the first conductivity type between the super junction structure 180 and the impurity layer 130. According to other embodiments, the super junction structure 180 may directly adjoin the impurity layer 130.

The super junction structure 180 is based on strip structures 140, which may run along a first lateral direction between mesa regions 150 that protrude from a base section 151 of the semiconductor portion 100. The base section 151 may include at least a portion of the impurity layer 130, the complete impurity layer 130 or the impurity layer 130 and a portion of the drift layer 120. The strip structures 140 and the mesa regions 150 may be parallel stripes alternately arranged at regular distances of some micrometers.

The mesa regions 150 may be intrinsic or may be uniformly doped. According to other embodiments, an impurity concentration in the mesa regions 150 changes along the vertical direction such that a degree of compensation may gradually or in steps change, for example from p loaded to n loaded or vice versa. According to the illustrated embodiment, a first section 181 of the super junction structure 180 oriented to the first surface 101 is lightly p-loaded, whereas second and third sections 182, 183 oriented to the second surface 102 are lightly n-loaded. According to an embodiment, the mean net impurity concentration in the mesa regions 150 or in the p and n loaded sections 181, 182, 183 is at most $2\times10^{14}$ cm$^{-3}$, for example at most $1\times10^{14}$ cm$^{-3}$.

Each strip structure 140 includes a fill structure 170 and a compensation structure 160 with at least a first section 160a and a second section 160b. The first and second sections 160a, 160b are inversely provided on opposing sides of the interjacent fill structure 170, wherein layered components of the compensation structure 160 are arranged mirror-inverted with reference to the fill structure 170.

The compensation structure 160 and each section of the compensation structure 160 include at least a first compensation layer 161 of the first conductivity type and a second compensation layer 162 of the second conductivity type. According to an embodiment the second compensation layer 162 is closer to the fill structure 170 than the first compensation layer 161. According to another embodiment the first compensation layer 161 is closer to the fill structure 170 than the second compensation layer 162. The compensation structure 160 may include further layers of the first and second conductivity type or intrinsic layers, for example an initially intrinsic interdiffusion layer between the first and second compensation layers 161, 162 or further pairs of complementary doped compensation layers 161, 162.

The compensation structure 160 lines at least mesa sidewalls of the mesa regions 150, wherein the mesa sidewalls extend tilted to the first surface 101, e.g. in the vertical direction. An interface between the compensation layers 161, 162 is parallel or approximately parallel to an interface between the compensation structure 160 and the material of the semiconductor portion 100.

The compensation structure 160 may line exclusively straight portions of the mesa sidewalls. According to the illustrated embodiment, the compensation structures 160 include buried third portions 160c lining portions of the base section 151 between the mesa regions 150 and connecting the first and second portions 160a, 160b. The third portion 160c may be curved or approximately planar. Further embodiments may provide further portions of the compensation structures 160 covering top faces of the mesa regions 150 between neighboring compensation structures 160.

The compensation layers 161, 162 are approximately conformal layers having a generally uniform thickness, respectively and may be single crystalline semiconductor layers grown by epitaxy with a crystal lattice growing in registry with a crystal lattice of the single crystalline semiconductor material of the semiconductor portion 100. According to another embodiment the compensation layers 161, 162 may be formed by re-crystallization of deposited semiconductor material, for example amorphous or poly-crystalline silicon, using a locally effective heating treatment. The first and second compensation layers 161, 162 may be in-situ doped during epitaxial growth. According to other embodiments, impurities of the first and second conductivity type may be introduced into the compensation layers 161, 162 by tilted implants, by plasma doping or by gas phase doping.

The thickness of the first compensation layer 161 may be at least 50 nm and at most 3 μm, by way of example. The thickness of the second compensation layer 162 may be at least 50 nm and at most 3 μm, by way of example. The first and second compensation layers 161, 162 may have the same thickness or may have different thicknesses. According to an embodiment, a thickness of the first compensation layer 161 is in the range of 200 nm to 1.5 μm and a thickness of the second compensation layer 162 is in the range of 200 nm to 1.5 μm. In a vertical section unit the total amount of impurities in the first compensation layer 161 may in substance correspond to the total amount of impurities in the second compensation layer 162. For example, both compensation layers 161, 162 may have the same thickness and the same mean net impurity concentration (doping level), e.g. in the range of about $2\times10^{15}$ cm$^{-3}$ to $3\times10^{17}$ cm$^{-3}$.

The fill structure 170 may include a dielectric liner 171 that covers and seals the compensation structure 160 and passivates the semiconductor surface. The dielectric liner 171 may consist of one single layer or may include two or more sub-layers provided from silicon oxide, silicon nitride, siliconoxynitride, aluminum oxide, aluminum nitride, an organic dielectric, for example polyimide, or a silicate glass, for example BSG (boron silicate glass), PSG (phosphorus silicate glass), or BPSG (boron phosphorus silicate glass). The dielectric liner 171 may fill the space between the first and second sections 160a, 160b of the compensation structure 160 completely. According to other embodiments, the dielectric liner 171 only lines the compensation structure 160 and the fill structure 170 includes a further portion containing fill materials, e.g. intrinsic single or poly crystalline semiconductor material, or an air gap 179. The presence of a suitable fill material or an air gap avoids mechanical strain which otherwise may be induced as a consequence of a complete trench fill into the surrounding semiconductor material.

The semiconductor device 500 further includes a control structure 200 for controlling a current flow through the semiconductor portion 100 between the first surface 101 and the second surface 102. The control structure 200 includes conductive structures, insulating structures and impurity zones formed or buried in the semiconductor portion 100 and may include conductive and insulating structures outside the semiconductor portion 100 as well.

At the side of the first surface 101, a first electrode structure 310, which may be electrically coupled to a source terminal S in case the semiconductor device 500 is an IGFET, to an emitter terminal in case the semiconductor device 500 is an IGBT or to an anode terminal in case the semiconductor device 500 is a semiconductor diode, may be electrically connected to the control structure 200. The first electrode structure 310 is electrically connected to impurity zones of the control structure 200 through which an on state or forward current flows in a conductive state of the semiconductor device 500.

A second electrode structure 320 directly adjoins the second surface 102 of the semiconductor portion 100. According to embodiments related to super junction IGFETs or semiconductor diodes, the second electrode structure 320 directly adjoins the impurity layer 130. According to embodiments related to super junction IGBTs, a collector layer of the second conductivity type may be formed between the impurity layer 130 and the second electrode structure 320. The second electrode structure 320 may be electrically coupled to a drain terminal D in case the semiconductor device 500 is an IGFET, to a collector terminal in case the semiconductor device 500 is an IGBT or to a cathode terminal in case the semiconductor device 500 is a semiconductor diode.

Each of the first and second electrode structures 310, 320 may consist of or contain, as main constituent(s) aluminum Al, copper Cu, or alloys of aluminum or copper, for example AlSi, AlCu or AlSiCu. According to other embodiments, one or both of the first and second electrode structures 310, 320 may contain one or more layers having nickel Ni, titanium Ti, silver Ag, gold Au, tungsten W, platinum Pt and/or palladium Pd as main constituent(s). For example, at least one of the first and second electrode structures 310, 320 includes two or more sub-layers, at least one of the sub-layers containing one or more of Ni, Ti, Ag, Au, W, Pt, and Pd as main constituent(s), or silicides and/or alloys there from.

FIG. 1B shows an electrical field profile in the semiconductor device 500 of FIG. 1A in case a blocking voltage is applied. In substance, the electric field extends between the heavily doped impurity layer 130 at a distance d3 to the first surface 101 and a corresponding heavily doped zone in the control structure 200 at a distance d1. The field penetrates only small parts of the control structure 200 and the heavily doped impurity layer 130. The electric field strength may increase from both sides up to a distance dm to the first surface 101 where the sign of the degree of compensation changes and where the electric field strength reaches a maximum value Emax.

The slope of the electric field strength depends on the value of the degree of compensation and is high where the degree of compensation is high and low where the degree of compensation is low. As a result, a peak area, where the electric field strength is sufficiently high to generate mobile charge carriers in case an avalanche mechanism has been triggered is only small. The generated carriers flowing to the electrodes decrease the slope of the electric field. The peak around Emax ensures that the position of Emax is stabilized for currents up to the desired avalanche currents ensuring that the voltage across the semiconductor device 500 does not immediately break down.

According to FIG. 1C the strip structures 140 cross a cell area 610 and extend into an edge area 690 surrounding the cell area 610 and separating the cell area 610 from an outer surface 103 of the semiconductor portion 100 that connects the first and second surfaces 101, 102. In the cell area 610 the first electrode structure 310 shown in FIG. 1A is electrically connected to impurity zones in the control structure 200 which carry a current in a conductive state of the semiconductor device 500, for example an anode zone in case the semiconductor device 500 is a semiconductor diode or a source zone of a transistor structure in case the semiconductor device 500 is an n-IGFET or n-IGBT.

In the edge area 690 either the first electrode structure 310 is absent and/or impurity zones carrying the on state or forward current in the conductive state, e.g. anode zones of semiconductor diodes or source zones of n-IGFETs and n-IGBTs, are absent, not electrically connected to the first electrode structure 310 or not operational for other reasons. The on state or forward current predominantly flows in the cell area 610 in an approximately vertical direction between the first and the second surfaces 101, 102. Only a negligible portion of the on state or forward current may be detectable in the edge portion 690 in a region close to the second surface 102. For vertical semiconductor devices 500 with the edge area 690 providing a lateral accommodation of the forward blocking voltage, equipotential lines are in substance parallel to the first and second surfaces 101, 102 in the cell area 610 and may be bowed or may run vertically in the edge area 690.

The strip structures 140 extend into the edge area 690. As a consequence, the cell area 610 is free of loading inhomogeneities inherent for the termination of the strip structures 140. Further, in the edge area 690 the strip structures 140 may include end sections 149 having a configuration that differs from a uniform configuration of end sections resulting from a linear projection of the strip structures 140 into the edge area 690 and terminating them with an approximately semicircular termination portion, respectively.

According to an embodiment the mean length of the end sections 149 is at least two times, e.g. at least four times, the pitch of the strip structures 140, wherein the pitch is the distance between the longitudinal center lines of two neighboring strip structures 140. The boundary line between the cell and edge areas 610, 690 may be marked by the outer edge of the last contact to a body zone within the control structure 200.

FIG. 1C schematically shows a termination structure 190 that includes the termination portions of the end sections 149 and that differs from a simple termination structure resulting from the linear projection of strip structures into the edge area 690 and from terminating all end sections 149 with a semicircular termination portion. The termination structure 190 allows a vertical or lateral variation of the loading, i.e. a lateral variation of the areal concentration or dose of p-type impurities minus the areal concentration or dose of n-type impurities. The local modification of the lateral or vertical loading may be used to increase the breakdown voltage, avalanche ruggedness or commutation ruggedness, by way of example.

Since in semicircular termination portions the different curvature radii for the first and second compensation layers 161, 162 result in termination portions which are loaded according to the conductivity type of the first compensation layer 161 having the greater curvature radius and limit the process window for the loading. The termination structure 190 may be effective for at least partially correcting a load inherent for semicircular or rounded termination portions.

According to this and the following illustrated embodiments, the first conductivity type is n-type, the second conductivity type is p-type, the first electrode structure 310 is a source electrode and the second electrode structure 320 is a drain electrode. According to other embodiments, the first conductivity type is p-type and the second conductivity type is n-type and the first electrode may be an anode or emitter electrode and the second electrode a cathode or collector electrode.

According to another embodiment, the super junction structure 180 has a loading of the second conductivity type across its complete vertical extension. For example, the second compensation layer 162 may be thicker than the first compensation layer 161 at equivalent impurity concentrations, or the impurity concentration in the second compensation layer 162 is higher than in the first compensation layer 161 or both. The mesa regions 150 may be intrinsic.

In addition, a loading according to the second conductivity type may be enhanced at the buried edges of the strip structures 140. For example, impurities of the second conductivity type may be introduced into or close to the bottom portion of the compensation structure 160 before providing the fill structure 170, e.g. by an implant into one of the layers of the compensation structure 160 or into a region of the semiconductor portion 100 directly adjoining the bottom portion before providing the compensation structure 160.

The enhanced loading at the buried edge of the strip structures 140 provides a prominent peak in the electric field profile at the buried edge of the super junction structure 180 that increases avalanche and commutation ruggedness.

The shape and dimensions of the end sections 149 may be set such that in the edge area 690, approximately perfect compensation is achieved and the nominal breakdown voltage is even higher in the edge area 690 than in the cell area 610. For example, a mask such as an oxide plug may cover termination portions during an implant providing the desired loading in the cell area 610.

Figure 2A:
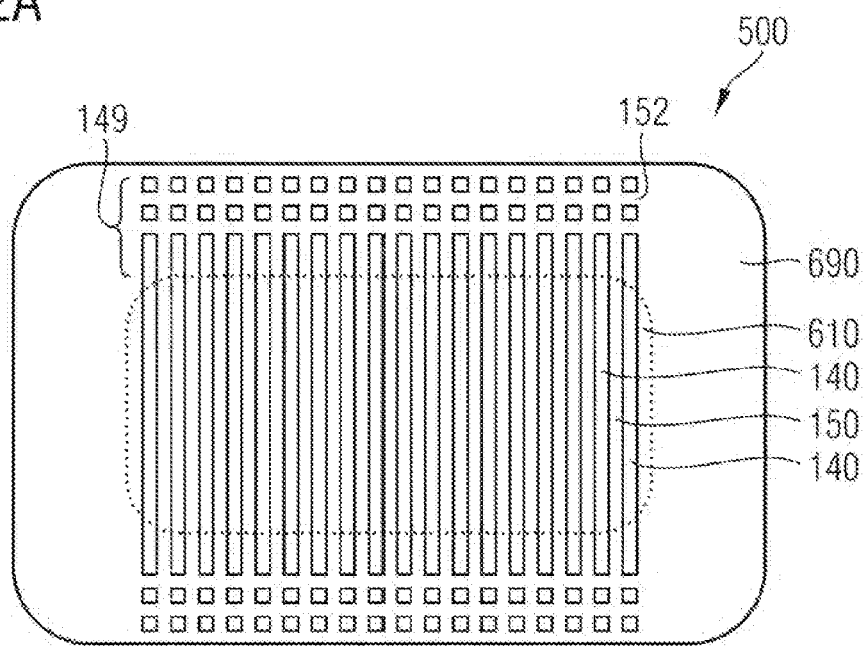
FIG. 2A is a schematic planar cross-sectional view of a super junction semiconductor device according to an embodiment providing strip structures with end sections segmented by mesa regions.
Figure 2B:
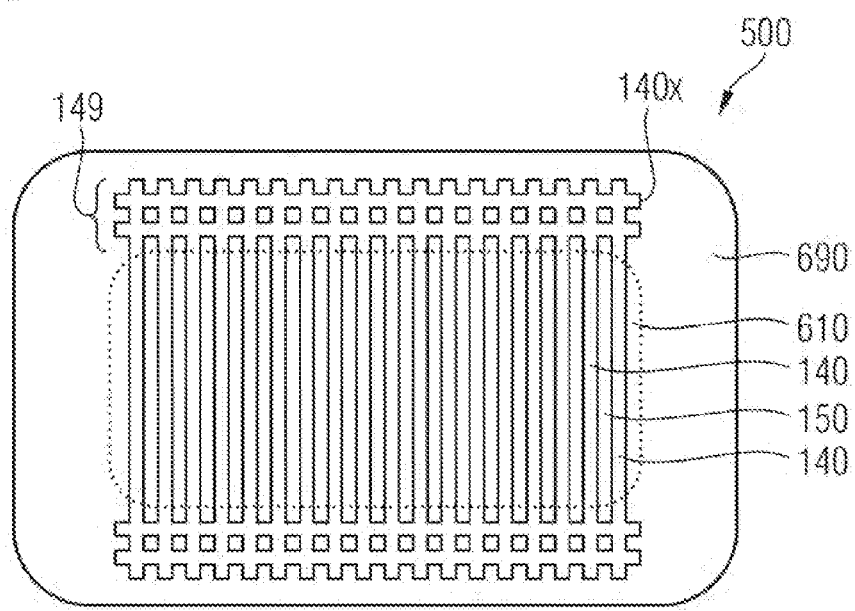
FIG. 2B is a schematic planar cross-sectional view of a super junction semiconductor device according to an embodiment providing strip structures with end sections segmented by auxiliary strip structures.

FIGS. 2A to 2B refer to embodiments with the end sections 149 of the strip structures 140 being segmented along the first lateral direction.

In FIG. 2A further mesa regions 152 segment the end sections 149 of the strip structures 140. Since the segmented end sections 149 provide more curvatures with a longer total arc length, the loading according to the conductivity type of the one of the first and second compensation layers 161, 162 having the greater curvature radius can be locally increased in the edge area 690.

The semiconductor device 500 of FIG. 2B includes auxiliary strip structures 140x extending in a second lateral direction and intersecting the end sections 149 in the edge area 690. At each intersection four corner portions with the first compensation layer 161 having a smaller curvature radius than the second compensation layer 162 locally increase the load according to the impurity type of the second compensation layer 162.

Figure 3A:
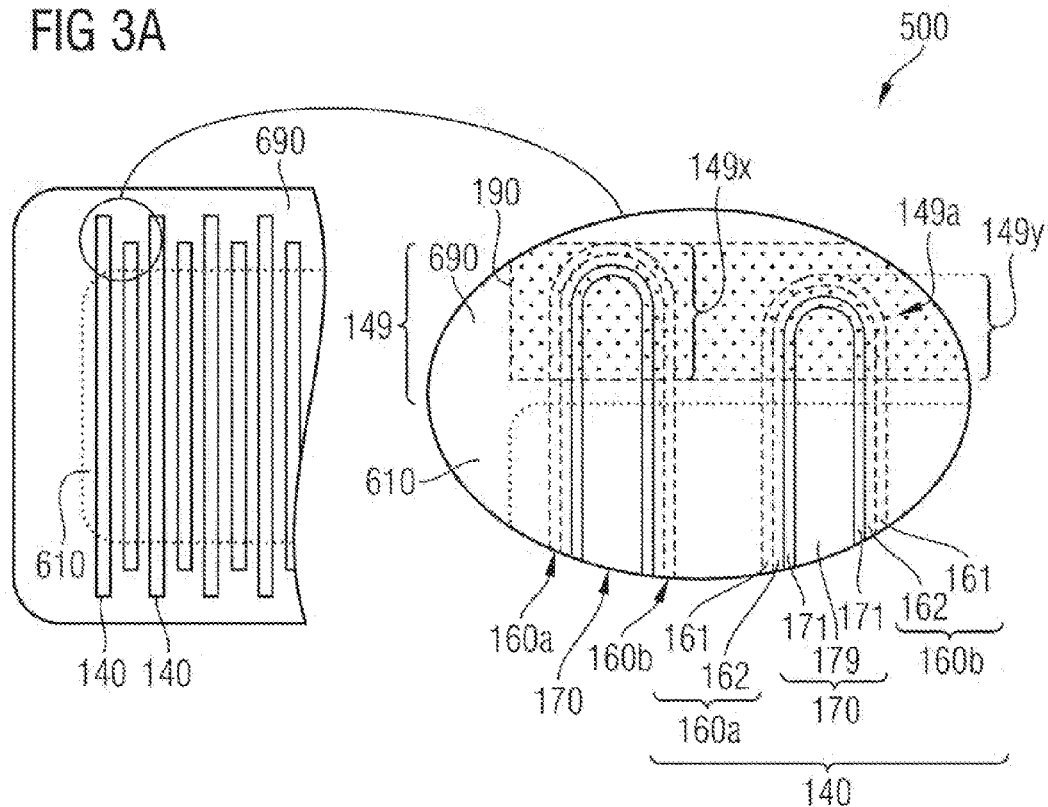
FIG. 3A is a schematic planar cross-sectional view of a super junction semiconductor device in accordance with an embodiment providing strip structures of different lengths.

The semiconductor device 500 of FIG. 3A provides a termination structure 190 including end sections 149x, 149y that differ in length. The end sections 149x, 149y are linear projections of linear strip structures 140 terminated by termination portions 149a having a semicircular, rectangular or polygonal shape, by way of example. By modification of the strip length, the loading induced by not fully compensated end sections 149x, 149y may be locally modulated.

According to another embodiment either the semiconductor material of the semiconductor portion 100 or the compensation structures 160 may contain an excess of p- or n-type impurities resulting in an intentional loading such that a variation of the length of the strip portions 140 additionally changes the loading in the edge area 690 locally.

As a result, the edge area 690 may be provided with a nominal breakdown voltage that differs from a nominal breakdown voltage in the cell area 610. For example, the nominal breakdown voltage in the edge area 690 may be set higher than the nominal breakdown voltage in the cell area 610 such that avalanche predominantly takes place in a defined portion of the cell area 610 and the occurrence of destructive current filaments accommodating the avalanche induced current in a portion of the cell area 610 close to the edge area 690 can be reduced. As a result, avalanche ruggedness may be improved.

The extension of the strip structures 140 may change between two, three or more different lengths in a regular manner. For example, the length of the end sections 149x, 149y of neighboring strip structures 140 alternate between a first length and a second, different length.

Figure 3B:
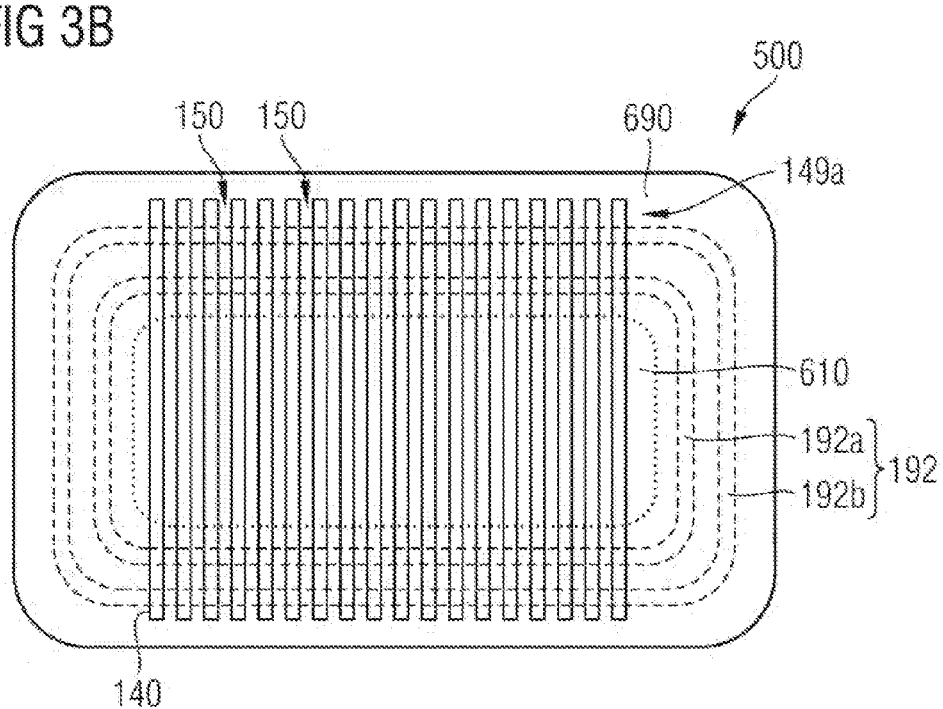
FIG. 3B is a schematic planar cross-sectional view of a super junction semiconductor device in accordance with an embodiment providing an edge area with a circumferential impurity structure.

The super junction semiconductor device 500 of FIG. 3B provides a circumferential impurity structure 192 in the edge area 690. The circumferential impurity structure 192 may extend from the first surface 101 as shown in FIG. 1A into the semiconductor portion 100. The circumferential impurity structure 192 may have the second conductivity type and may at least partially compensate a locally increased loading of the first conductivity type resulting from the greater curvature radius of the first compensation layer 161 in the termination portions 149a of the strip structures 140.

The circumferential impurity structure 192 may consist of one single concentric ring or may include two or more spatially separated segments. For example, the circumferential impurity structure 192 includes a first and a second concentric ring 192a, 192b which are spatially separated from each other. Other embodiments may provide one or more segmented rings separated by further mesa regions.

FIGS. 3C and 3D shows an edge area 690 with auxiliary strip structures 140y, 140z extending in the second lateral direction perpendicular to the first lateral direction. The auxiliary strip structures 140y, 140z may have the same dimensions and the same configuration as the strip structures 140 and provide further portions 690b of the edge area 690 with a configuration at least similar to portions 690a into which the strip structures 140 extend. With the auxiliary strip structures 140y, 140z the loading induced by the end sections 149 may be more uniform along the whole circumference of the edge area 690.

The auxiliary strip structures 140y illustrated in FIG. 3C are structurally connected with the outermost strip structures 140, whereas further mesa regions 153 spatially separate the auxiliary strip structures 140z of FIG. 3D from the outermost strip structures 140.

Figure 3E:
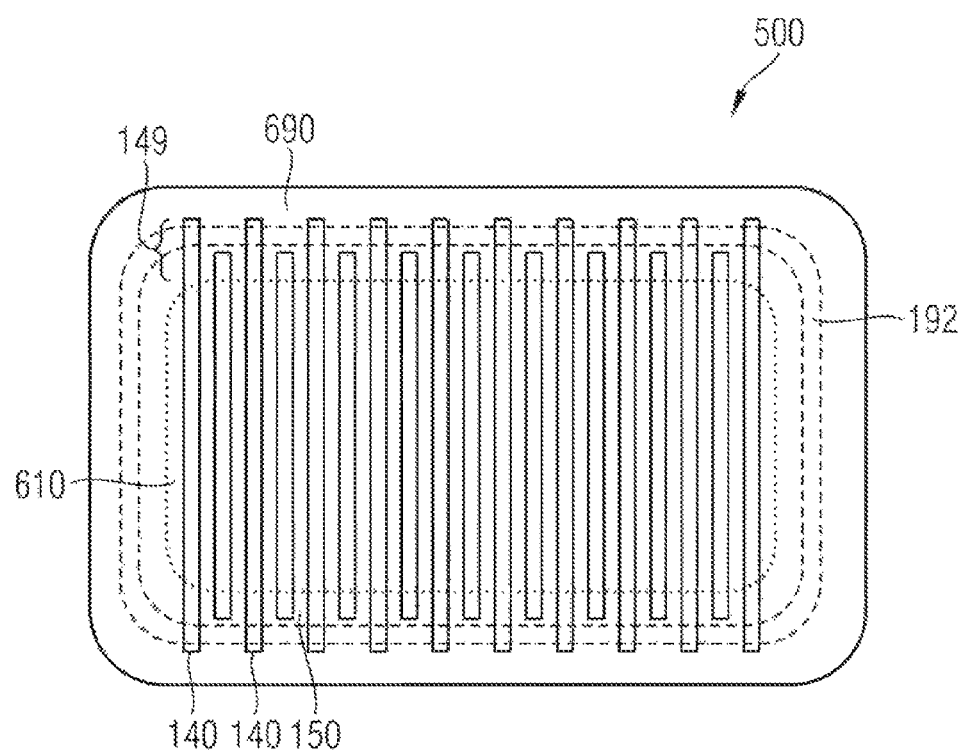
FIG. 3E is a schematic planar cross-sectional view of a super junction semiconductor device according to an embodiment providing strip structures of different length and a circumferential impurity structure in an edge area.

FIG. 3E combines an embodiment providing strip structures 140 of different length with a circumferential impurity structure 192 that may consist of one concentric ring and that may compensate a local loading of the first conductivity type resulting from the different curvature radii of the compensation layers 161, 162 in the end sections 149.

Figure 4A:
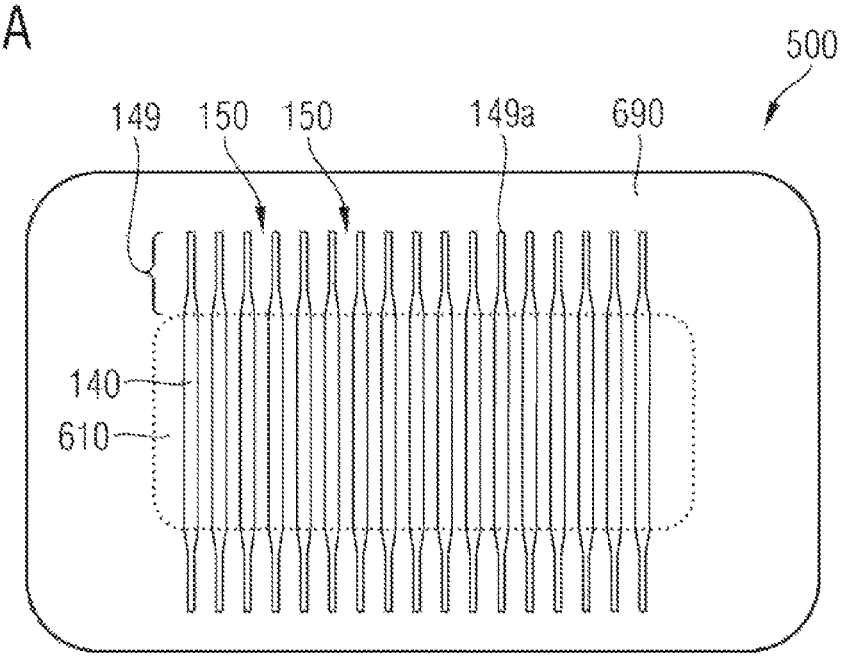
FIG. 4A is a schematic planar cross-sectional view of a super junction semiconductor device in accordance with an embodiment providing strip structures with varying widths in an edge area.

The semiconductor device 500 of FIG. 4A includes strip structures 140 with end sections 149 having a variable width. While asymmetries of the compensation at the beginning and at the end of a tapering portion may approximately cancel each other out, the termination portion 149a has a smaller diameter and less loading results from the different curvature radii for the first and second compensation layers. In combination with an intentional loading induced by a background doping of the semiconductor portion 100 including the mesa regions 150, the variation of the width of the end sections 149 gives a further degree of freedom for improving device parameters by modulating the electric field distribution in the edge area 690.

Figure 4B:
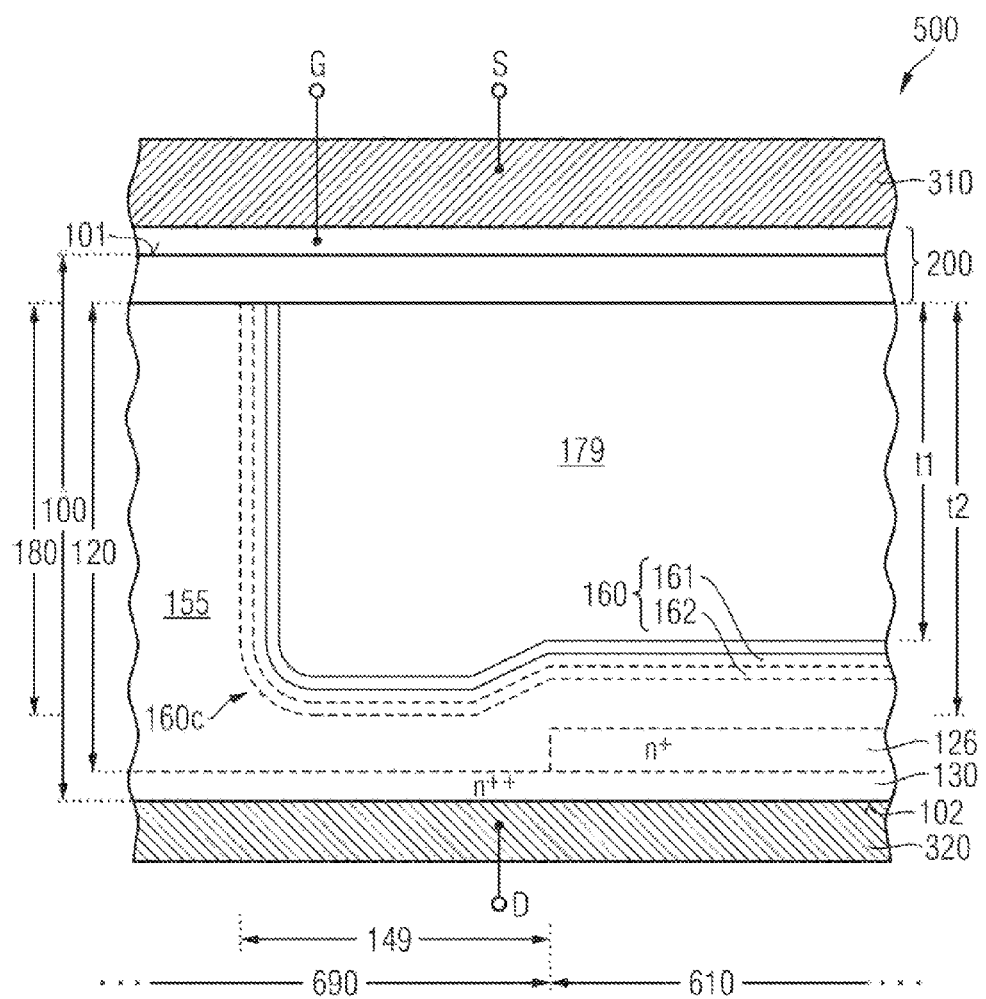
FIG. 4B is a schematic planar cross-sectional view of a portion of a super junction semiconductor device in accordance with an embodiment providing strip structures with varying dimensions along a vertical direction.

The cross-sectional plane of FIG. 4B cuts a strip structure 140 along the first lateral direction. The strip structures 140 include end sections 149 changing the dimension along the vertical direction. Portions of the end sections 149 have a vertical extension perpendicular to the lateral directions that differs from a vertical extension of the strip structures 140 in the cell area 610. For example, at least a portion of the end sections 149 may have a second vertical extension t2 greater or smaller than a first vertical extension t1 of the strip structures 140 in the cell area 610. The variation of the vertical extension may be combined with a variation of the width of the strip structures 140 to exploit a higher etch rate during RIE (reactive ion beam etching) in a wider trench, so that the depth variation may be achieved during the same etch process providing trenches both for the strip structures 140 in the cell area 610 and the end sections 149.

The buried third sections 160c of the compensation structure 160 may be rounded and produce a local loading of the conductivity type of the first compensation layer 161. In case of a combination with intentional loading the distance of the local loading to the first surface 101 may be controlled in the edge area 690 to adjust device parameters like breakdown voltage, avalanche ruggedness and commutation ruggedness, by way of example.

According to an embodiment, the cell area 610 may include a buffer structure 126 of the first conductivity type that is absent in the edge area 690.

In FIGS. 5A and 5B end sections 149 of neighboring strip structures 140 are structurally connected with each other, wherein the first compensation layers 161 of the connected strip structures 140 form a continuous layer and the second compensation layers 162 of the connected strip structures 140 form a continuous layer. Since the embodiments get by with less volume assigned to rounded termination portions 149a, the loading of the conductivity type of the first compensation layer 161, which is inherent for the rounded termination portions 149a, is reduced.

The semiconductor device 500 of FIG. 5A provides connection sections 148 that may have the dimensions and/or the internal configuration of the strip structures 140. The connection sections 148 connect both end sections 149 of pairs of neighboring strip structures 140 with each other at the end of the end sections 149. Each pair of strip structures 140 forms a closed loop as illustrated.

Similarly, the semiconductor device 500 of FIG. 5B provides strip structures 140 with connection sections 148 that may have the dimensions and/or the internal configuration of the strip structures 140. Two connection sections 148 connect one end section 149 of one of the strip structures 140 to an end section 149 of an adjoining one of the strip structures 140 at a first side and the other end section 149 of the same strip structure 140 to an end section 149 of an adjoining one of the strip structures 140 at a second side opposite to the first side. Some or all of the strip structures 140 may be connected to each other and form a meandering strip structure as illustrated.

In FIG. 6 the semiconductor device 500 provides a termination structure 190 with spatially separated termination portions 149a assigned to each single end section 149. A configuration of the termination portions 149a is set such that at the same width and vertical extension of the strip structures 140 a degree of compensation in the termination portions 149a deviates less from a degree of compensation outside the termination portion 149a than a degree of compensation in a semicircle termination portion. A loading of the conductivity type of the first compensation layer 161 inherent for semicircle termination portions can be reduced.

FIG. 7A shows a termination portion 149a with an implant zone 162a of the second conductivity type, which is that of the second compensation layer 162, in a section of the first compensation layer 161 having the first conductivity type. The implant zone 162 reduces or compensates the inherent loading of the termination portion 149a.

The implant zone 162a may be provided by an angled implant parallel to the first lateral direction before providing the dielectric liner 171. According to other embodiments, the implant zone 162a may be provided in the second compensation layer 162 to locally increase the impurity concentration in the second compensation layer 162. More generally the implant zone 162 may be formed in the compensation structure 160 or in a region of the semiconductor portion 100 adjoining to the termination portion 149a. An implant mask, e.g. a semiconductor oxide may shield a bottom portion between the mesa regions 150 as well as the mesa top regions against the tilted implant.

In FIG. 7B the termination portions 149a include a sidewall portion 149b running in a lateral direction perpendicular to the strip structures 140 to reduce a loading inherent for semicircular termination portions. The sidewall portion 149b may be provided by an etch process considering the orientation of the crystal planes in the semiconductor portion 100.

According to another embodiment the compensation layers 161, 162 are provided by introducing impurities in previously deposited intrinsic semiconductor layers and a mask may cover the termination portions 149a and expose the intrinsic semiconductor layers outside the termination portions 149a during the process of introducing impurities such that the doped compensation layers 161, 162 are not formed in the termination portions 149a.

FIG. 7C shows a termination portion 149a with a circular portion having an arc length greater than a semicircle with a diameter given by the width of the fill structure 170 outside the termination portion 149a. Due to the higher arc length, the inherent loading due to the different curvature radii of the first and second compensation layers 161, 162 may be increased.

The termination portion 149a of FIG. 7D includes two converging portions running tilted to the first lateral direction and converging at an angle. The converging portions may intersect each other or may be connected by further portions, e.g. a portion having a length smaller than the width of the fill structure 170 and running perpendicular to the first lateral direction.

Since epitaxy may provide a growth rate dependent on crystal orientation or may provide a faster growth rate in narrow or spiky corners, the second compensation layer 162 may grow faster at an angle narrowed by the first compensation layer 161 such that a locally thicker second compensation layer 162 may compensate the effect of the greater curvature radii for the first compensation layer 161.

Figure 8:
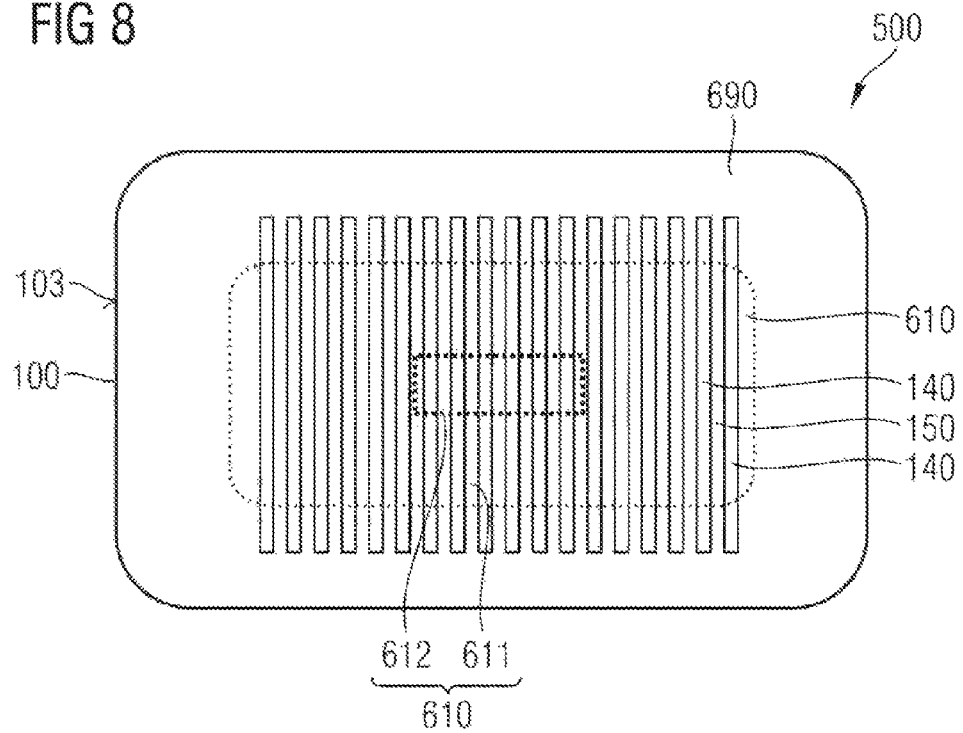
FIG. 8 is a schematic planar cross-sectional view of a of a super junction semiconductor device according to an embodiment providing a first nominal breakdown voltage in a first portion of a cell area and a second nominal breakdown voltage in a second portion of the cell area.

The super junction semiconductor device in FIG. 8 has a first nominal breakdown voltage in a first portion 611 and a second nominal breakdown voltage that is lower than the first nominal breakdown voltage in a second portion 612 of the cell area 610.

The breakdown voltage of the cell area 610 or a portion thereof is a known function of the impurity distributions and the geometry parameters of the super junction structure. The nominal breakdown voltage of the cell area 610 or a portion thereof is that breakdown voltage that results from the target geometry parameters and the target impurity distributions for the super junction structure. Due to process-induced inhomogeneities, the actual breakdown voltage of an arbitrary portion of the cell area 610 may deviate from the nominal breakdown voltage.

When in a conventional device a controlled avalanche breakthrough has been triggered, e.g. in an unclamped inductive switching environment, the position at which the avalanche breakdown occurs in the cell area 610 depends on the homogeneity of the geometry parameters and impurity quantities. If the homogeneity is high the generated charge carriers and the off-state current may uniformly distribute over the whole cell area 610 and the thermal stress disperses over a comparatively large area. If the homogeneity is low the generated charge carriers and the off-state current concentrate at few spots resulting in high thermal stress in comparatively narrow areas. The local thermal stress may destroy a portion of the cell area 610 such that the device characteristics gradually or abruptly degrade. As a consequence, the avalanche ruggedness often depends on process parameters that cannot fully be controlled in an economic way.

With the super junction semiconductor device 500 the area in which the avalanche breakdown occurs is in substance defined by the well-defined second portion 612. According to an embodiment, the difference in the nominal breakdown voltages among the first and second portions 611, 612 is higher than an estimated variation of the actual breakdown voltage in the first portion 611. For example, the second nominal breakdown voltage is at most 90% of the first nominal breakdown voltage. As a result approximately no avalanche effect occurs in the first portion 611.

The difference between the first and the second nominal breakdown voltages may be selected such that at least 50% of the mobile charge carriers generated in the avalanche breakdown are generated in the second portion 612. The second portion 612 may cover at least 5% and at most 80%, for example approximately 10% to 20% of the cell area 610. Proximity effects or loading effects provoke geometry fluctuations close to the edge of the cell area 610. For example, a shortage of an etchant near the outer surface 103 may result in that close to the outer surface 103 etched trenches and areas obtained by filling the etched trenches are narrower and/or shallower than in a central portion of the semiconductor body 100. According to an embodiment, the second portion 612 may be spaced from the edges of the cell area 610. As a result, in the second portion 612 the geometry parameters and impurity distributions are more uniform and the avalanche effect disperses uniformly in the second portion 612.

The cross-sectional area of the second portion 612 may be significantly narrower than the cell area 610, for example at most 15% of the cell area 610. Since less process inhomogeneities occur in a narrower area than in a wider area and proximity and loading effects are reduced due to the similar neighborhood, the avalanche behavior is more rugged. The cross-sectional area of the second portion 612 may be at least 2% of the cell area 610 such that in the avalanche breakdown charge carrier generation and off-state current extend over a sufficiently large area to avoid spots of excessive heat.

The second portion 612 may be provided in portions of the cell area 610 that dissipate thermal energy at best. According to an embodiment, the second portion 612 has a single partition in the vertical projection of center portions of metallic electrodes provided on the first and second surfaces. For example, the second portion 612 may be provided in a central portion of the cell area 610 or the semiconductor body 100 at a distance to the edge area 690 such that a higher amount of power can be dissipated without irreversibly destroying transistor cells. Proximity effects can be avoided.

Other embodiments may provide a segmented second portion 612 with two of more spatially spaced segments, for example in and/or close to the vertical projection of contact sections, e.g. bonding pads, where wires are bonded to a metal structure of the super junction semiconductor device 500. Concentrating the avalanche effect in a region with sufficient heat dissipation further improves avalanche ruggedness. The cross-section of the second portion 612 may be a circle, an ellipsoid, an oval, a hexagon, or a rectangle, e.g. a square.

Figure 9A:
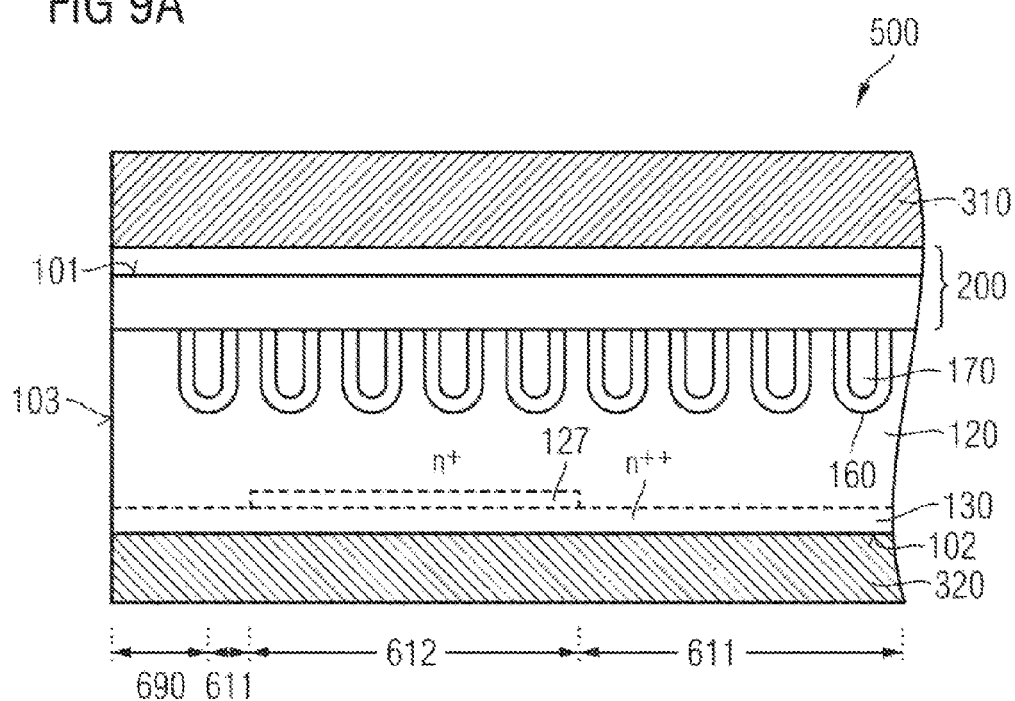
FIG. 9A is a schematic cross-sectional view of a super junction semiconductor device in accordance with an embodiment providing a buffer structure in a first portion of the cell area.

FIG. 9A refers to a semiconductor device 500 with the semiconductor portion 100 including an impurity layer 130 of the first conductivity type directly adjoining a second surface 102 opposite to the first surface 101. In the second portion 612 a buffer structure 127, which may be a continuous or segmented structure and which has the first conductivity type, is provided between the strip structures 140 and the impurity layer 130. The buffer structure 127 is absent in the first portion 611. The buffer structure 127 further detunes the n-type loading in the n-loaded section of the semiconductor portion 100 and locally reduces the nominal breakdown voltage in the second portion 612 compared to that in the first portion 611. In another embodiment the buffer structure 127 provides a field stop and is more highly doped than the drift layer 120.

Figure 9B:
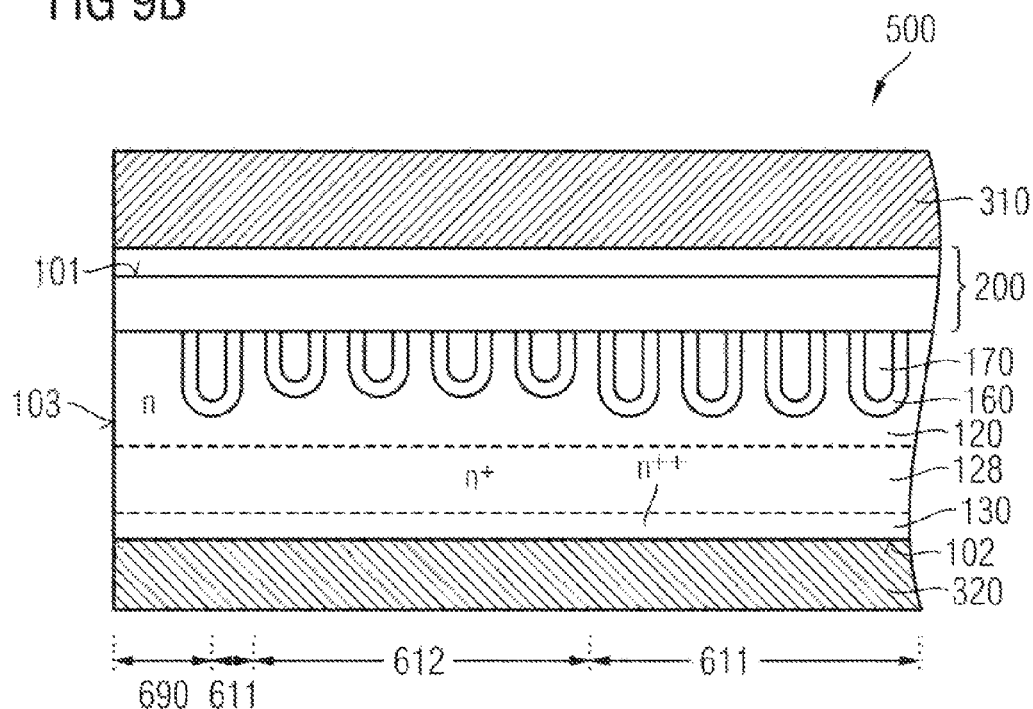
FIG. 9B is a schematic cross-sectional view of a portion of a super junction semiconductor device in accordance with an embodiment providing strip structures with a first vertical dimension in a first portion of the cell area and a second vertical dimension in a second portion.

FIG. 9B refers to an embodiment providing strip structures 140 with a first vertical extension in the first portion 611 of the cell area 610 and a second, different vertical extension in the second portion 612. For example, the strip structures 140 are shallower in the second portion 612 and a local n-loading, which may result from background impurities in the corresponding section of the drift layer 120 or from an unbalanced compensation structure 160, is increased and the nominal breakdown voltage is locally decreased.

Figure 9C:
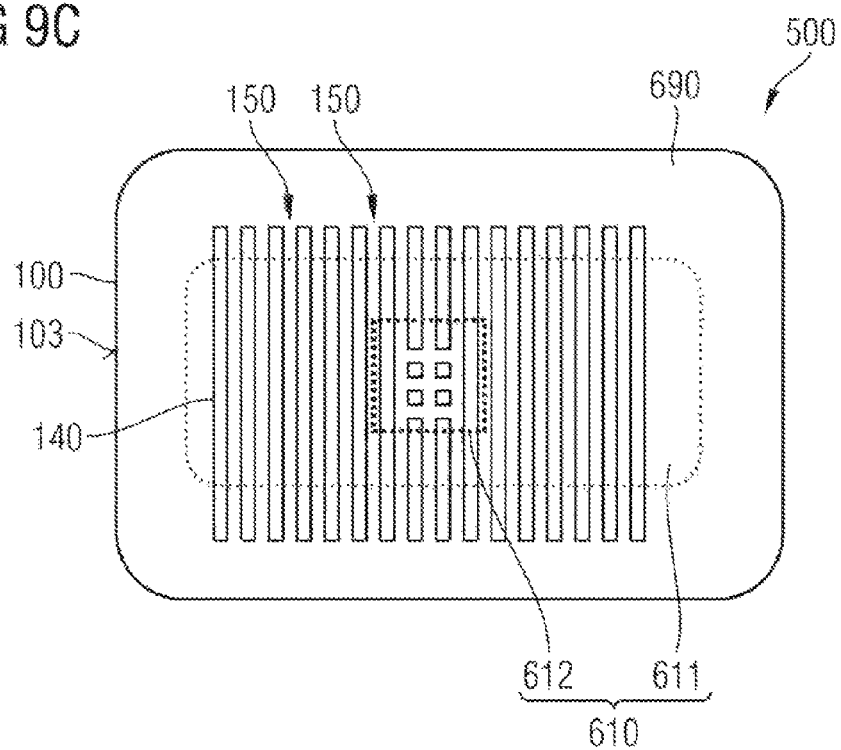
FIG. 9C is a schematic planar cross-sectional view of a super junction semiconductor device in accordance with an embodiment providing segmented strip structures in a first portion of the cell area.

In the second portions 612 of the semiconductor device 500 of FIG. 9C, additional mesa regions 151c segment the strip structures 140 to locally increase the n-type load in a vertical section of the drift layer 120 corresponding to the buried edges of the strip structures 140 to locally reduce the nominal breakdown voltage.

The semiconductor device 500 of FIG. 9D provides first mesa regions 150a in the first portion 611 and second mesa regions 150b in the second portion 612, wherein the first mesa regions 150a contain more impurities of the first or the second conductivity type in a vertical section than the second mesa regions 150b. For example, in case the first and the second mesa regions 150a, 150b have a first lightly p-loaded section oriented to the first surface 101 and a second lightly n-loaded section oriented to the second surface 102, the second mesa regions 150b may have a higher p-load in the first section or a higher n-load in the second section. In another embodiment the second mesa regions 150b may be broader or narrower than the first mesa regions 150a, depending on the overall loading situation.

Figure 10B:
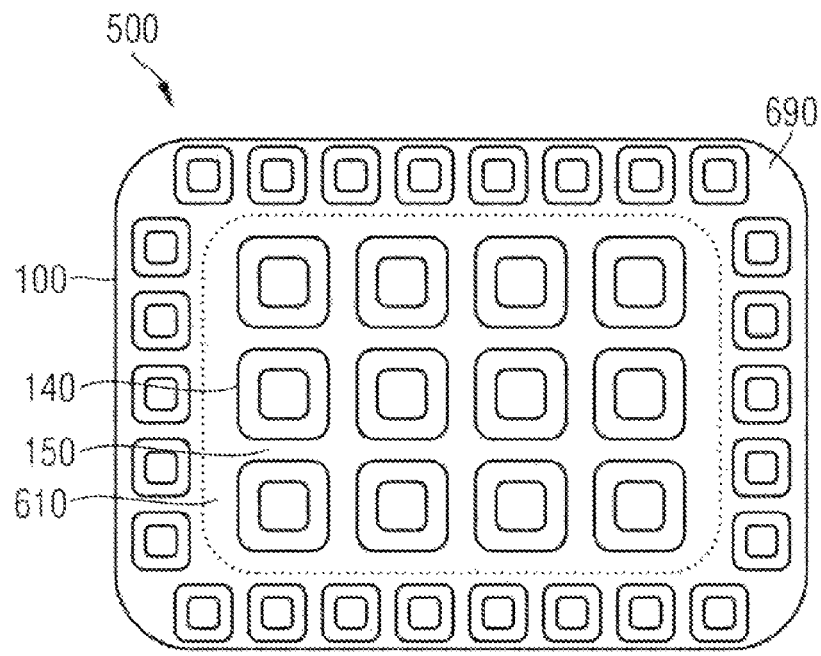
FIG. 10B is a schematic planar cross-sectional view of a super junction semiconductor device in accordance with an embodiment providing strip structures forming neighboring loops.

In FIGS. 10A and 10B the semiconductor device 500 includes a semiconductor portion 100 with strip structures 140 arranged between mesa regions 150 protruding from a base section in a cell area 161. Each strip structure 140 includes a compensation structure with a first and a second section inversely provided on opposing sides of a fill structure. The fill structure may include lightly doped silicon or an air gap. Each section includes at least a first compensation layer 161 of a first conductivity type and a second compensation layer 162 of a complementary second conductivity type. The strip structures 140 may be closed loops arranged within the cell area 610. The strip structures 140 may be absent in the edge area 690.

A first electrode structure is arranged at a side of the semiconductor portion 100 oriented to the mesa regions 150. In the cell area 610 the first electrode structure is electrically connected to impurity zones through which a current flows in a conductive state of the semiconductor device 500. In the edge area 690, the first electrode structure and/or the impurity zones through which a current flows in a conductive state may be absent, not connected, or not functional for other reasons such that in the edge area 690 only a negligible current flows in a region close to a second surface 102 opposite to the first surface.

The looped strip structures 140 avoid local loadings resulting from asymmetries at termination portions. In the bowed sections, which may be quadrants, the first compensation layer 161 has a greater curvature radius than the second compensation layer 162 at the outline, whereas along the inner line the second compensation layer 162 has the greater curvature radius such that the asymmetric loadings cancel each other out at least in parts.

FIG. 10A provides strip structures 140 exclusively in the cell area 610. The edge area 690 may or may not include a concentric circumferential impurity structure 192, which may have the second conductivity type. The circumferential impurity structure 192 may be a shallow well of the second conductivity type extending from the first surface into the semiconductor portion 100. According to another embodiment, the edge area 192 may include one or more further strip structures 140, which may form continuous or segmented concentric loops.

FIG. 10B refers to strip structures 140 forming neighboring rings or loops in the cell area 610. The loops may have different dimensions in various portions of the cell area 610 to locally modulate the nominal breakdown voltage. The edge area 690 may be provided without looped strip structures 140, with a circumferential strip structure or with looped strip structures 140 having the same or different dimensions as the strip structures 140 in the cell area 610.

Figure 11A:
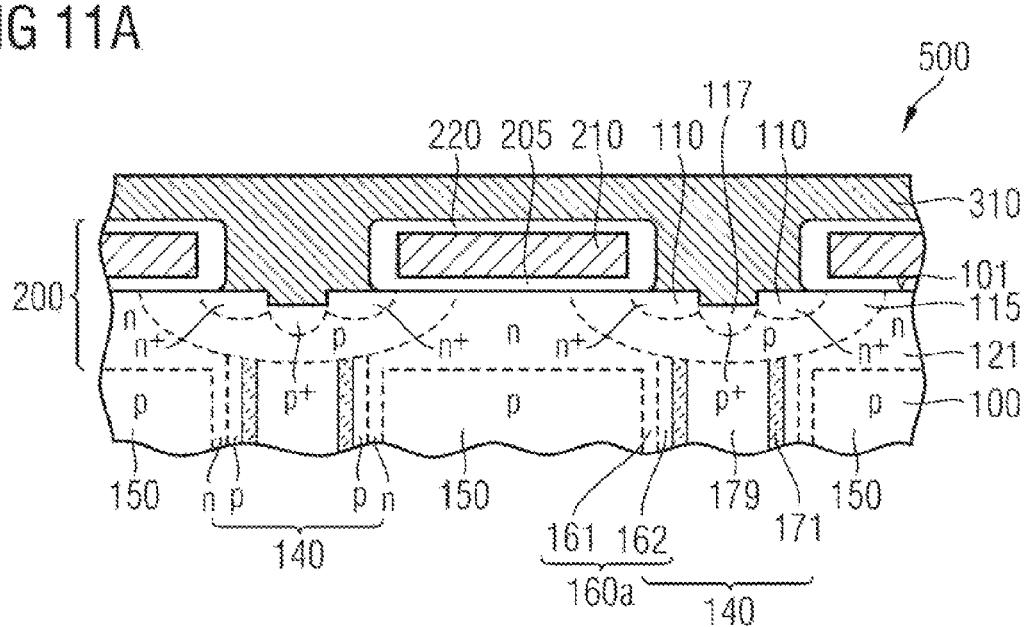
FIG. 11A is a schematic cross-sectional view of a control portion of a super junction semiconductor device in accordance with embodiments providing planar transistors with gate electrodes outside a semiconductor portion.
Figure 11B:
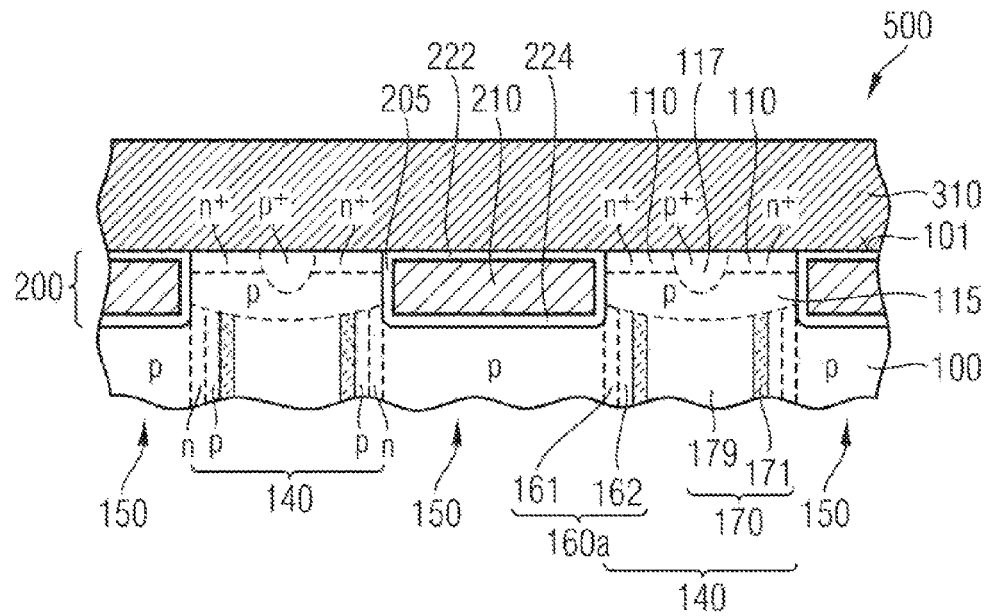
FIG. 11B is a schematic cross-sectional view of a control portion of a super junction semiconductor device in accordance with embodiments providing vertical transistors with buried gate electrodes and with source zones provided in the vertical projection of compensation trenches.
Figure 11C:
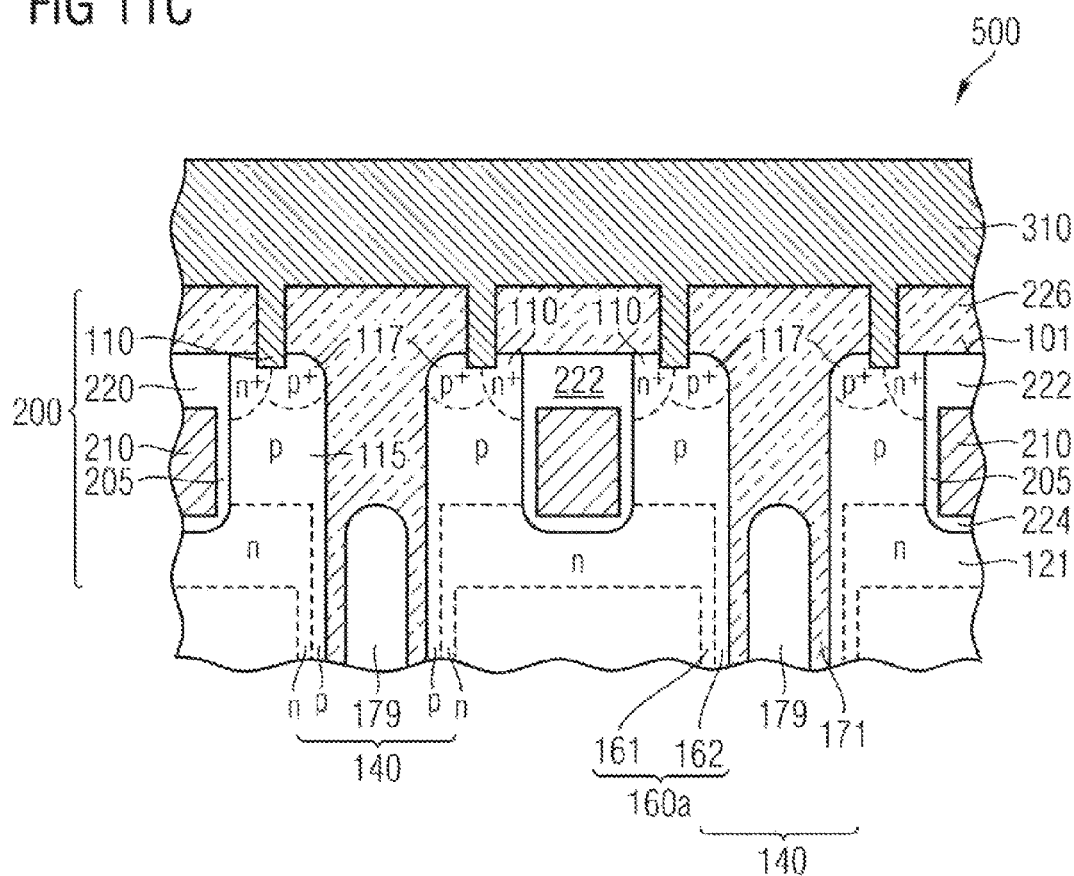
FIG. 11C is a schematic cross-sectional view of a control portion of a super junction semiconductor device in accordance with embodiments providing vertical transistors with buried gate electrodes and with source zones provided in mesa regions.

FIGS. 11A to 11C illustrate embodiments of the control structure 200 of the semiconductor device 500. The control portions 200 are based on IGFET cells with the first compensation layer 161 of the compensation structure 160 forming part of the drain structure of the respective IGFET cell.

FIG. 11A shows a control structure 200 including planar FETs with gate electrodes 210 provided outside the semiconductor portion 100. The semiconductor portion 100 includes body zones 115 of the second conductivity type extending from the first surface 101 into the semiconductor portion 100. The body zones 115 may be formed in a semiconductor body that is provided in the vertical projection of the compensation trenches 170 between the compensation trenches 170 and the first surface 101. For example, the semiconductor bodies may be formed by filling or overgrowing previously formed compensation trenches 170 by epitaxy or by annealing a deposited semiconductor layer, for example by using a laser.

The body zones 115 may have a mean net impurity concentration of at least $1 \times 10^{15}$ cm$^{-3}$ and at most $1 \times 10^{18}$ cm$^{-3}$. Each body zone 115 may be structurally connected to the second compensation layer 162 of the compensation structure 160 assigned to one of a plurality of strip structures 140 running between semiconductor mesas 150. In each body zone 115, one or two source zones 110 of the first conductivity type are formed as wells embedded in the body zones 115 and extend from the first surface 101 into the base zones 115. Heavily doped contact zones 117 may extend between neighboring source zones 110 into the body zones 115 for providing an ohmic contact between the first electrode structure 310 and the body zones 115.

In each IGFET cell, a gate dielectric 205 capacitively couples a gate electrode 210 with a channel portion of the body zone 115 such that a potential applied to the gate electrode 210 controls the charge carrier distribution in the channel portion between the source zones 110 and a link zone 121 of the first conductivity type, which may be formed in the semiconductor mesas 150 along the first surface 101 and which may be structurally connected with the first compensation layer 161. The link zone 121 may directly adjoin the first surface 101 such that in the on state of the IGFET cell a conductive channel formed in the body zone 115 along the gate dielectric 205 connects the source zone 110 with the first compensation layer 161 through the link zone 121.

A dielectric structure 220 encapsulates the gate electrodes 210 and dielectrically insulates the gate electrodes 210 from the first electrode structure 310. The first electrode structure 310 is electrically connected to the source zones 110 and the contact zones 117 through openings between the insulated gate electrode structures 210.

According to another embodiment, the source and body zones 110, 115 are formed in the semiconductor mesas 150, wherein the first compensation layer 161 having the first conductivity type may be closer to the fill structure 170 than the second compensation layer 162 having the second conductivity type. For example, for an n-FET or n-IGBT with the lateral IGFET cells formed in the semiconductor mesas 150, the n-type first compensation layer 161 may be closer to the fill structure 170 than the p-type second compensation layer 162.

FIG. 11B corresponds to the control structure 200 of FIG. 11A with respect to the formation of the body zones 115, the contact zones 117 and the source zones 110 in a semiconductor layer in the vertical projection of the compensation trenches 170. Different than in FIG. 11A, buried gate electrodes 210 are formed in gate trenches extending between neighboring strip structures 140 into the semiconductor portion 100. The gate trenches may have the same width as the mesa regions 150 between the strip structures 140. Channel portions extend through the body zones 115 in a vertical direction along vertical gate dielectrics 205. In each IGFET cell, the channel may be formed between the source zone 110 and the first compensation layer 161 or between the source zone 110 and a link zone, which has the first conductivity type and which is structurally connected with the first compensation layer 161.

A first dielectric structure 222 dielectrically insulates the gate electrode 210 from the first electrode structure 310 and a second dielectric structure 224 dielectrically insulates the gate electrode 210 from the mesa region 150.

FIG. 11C illustrates a control structure 200 with the gate electrodes 210, the body zones 115 and the source zones 110 formed in the mesa regions 150 between the strip structures 140. The gate electrodes 210 are formed in gate trenches extending from the first surface 101 into the mesa regions 150. For each IGFET cell, a first dielectric structure 222 separates the gate electrode 210 from the source zones 110, which extend from the first surface 101 along the gate trench into the mesa region 150. A second dielectric structure 224 separates the gate electrode 210 from a link zone 121 of the first conductivity type, which is formed in the mesa region 150 and which is structurally connected to the first compensation layer 161. The body zone 110 is formed in a vertical section of the mesa regions 150 corresponding to the vertical extension of the gate electrodes 210 and is structurally connected to the second compensation layer 162.

A third dielectric structure 226 dielectrically insulates the first electrode structure 310 from the mesa regions 150 and may form plugs in the uppermost portion of the strip structures 140. Each plug seals an air gap 179 formed in a central portion of a filling structure 170 and protects sidewalls of body zones 115 directly adjoining the strip structures 140. According to another embodiment, the gate electrodes 210 may be provided outside the semiconductor mesas 150 instead of or within the plugs.

Each of the control structures 200 of FIGS. 11A to 11C and others may be combined with the semiconductor devices 500 as illustrated in the previous Figures.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A super junction semiconductor device, comprising:
   a semiconductor portion comprising strip structures in a cell area, each strip structure comprising a compensation structure that comprises a first and a second section inversely provided on opposite sides of a fill structure, each first and second section comprising a first compensation layer of a first conductivity type and a second compensation layer of a complementary second conductivity type,
   wherein the strip structures are linear stripes extending through the cell area in a first lateral direction and extending into an edge area surrounding the cell area in lateral directions, each strip structure comprising an end section with a termination portion in the edge area in which the first compensation layer of the first conductivity type of the first section is connected with the first compensation layer of the first conductivity type of the second section via a first conductivity layer, and the second compensation layer of the second conductivity type of the first section is connected with the second compensation layer of the second conductivity type of the second section via a second conductivity layer.

2. The super junction semiconductor device of claim 1, further comprising:
   a first electrode structure provided at a top of the semiconductor portion oriented to the strip structures and electrically connected, in the cell area, to impurity zones through which an on state or forward current flows in a conductive state of the semiconductor device; and
   a second electrode structure attached to a bottom of the semiconductor portion.

3. The super junction semiconductor device of claim 2, further comprising:
   a third electrode structure of a gate electrode and a gate dielectric, the gate electrode being disposed on the semiconductor portion and separated from the semiconductor portion by the gate dielectric.

4. The super junction semiconductor device of claim 2, wherein the semiconductor portion comprises mesa regions between the strip structures, the mesa regions protruding from a base portion.

5. The super junction semiconductor device of claim 4, further comprising:
   a third electrode structure of a gate electrode and a gate dielectric disposed in the semiconductor portion, the gate dielectric comprising two layers, one of which separates the gate electrode from the mesa region and another one of which separates the gate electrode from the first electrode structure.

6. The super junction semiconductor device of claim 4, further comprising:
   a third electrode structure of a gate electrode and a gate dielectric disposed in the semiconductor portion, the gate dielectric comprising two layers, one of which separates the gate electrode from a link zone in the mesa region and another one of which separates the gate electrode from the impurity zone.

7. The super junction semiconductor device of claim 1, wherein the end sections of neighboring strip structures have different lengths along the first lateral direction.

8. The super junction semiconductor device of claim 1, wherein the fill structure includes an air gap.

* * * * *